（12） United States Patent
Miyamae et al.

(10) Patent No.: US 11,290,108 B2
(45) Date of Patent: Mar. 29, 2022

(54) NEGATIVE VOLTAGE PROTECTION FOR BUS INTERFACE DEVICES

(71) Applicant: Cypress Semiconductor Corporation, San Jose, CA (US)

(72) Inventors: Toru Miyamae, Aichi (JP); Kazuhiro Tomita, Kasugai (JP); Koji Okada, Yokohama (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/151,575

(22) Filed: Jan. 18, 2021

(65) Prior Publication Data

US 2021/0359685 A1 Nov. 18, 2021

Related U.S. Application Data

(60) Provisional application No. 63/023,387, filed on May 12, 2020.

(51) Int. Cl.
*H03K 5/08* (2006.01)
*H03K 19/003* (2006.01)
*H03K 19/0175* (2006.01)

(52) U.S. Cl.
CPC ............... *H03K 19/00315* (2013.01); *H03K 19/017509* (2013.01)

(58) Field of Classification Search
CPC  H03K 5/08; H03K 19/00315; H01L 27/0266; H01L 27/0251; H01L 27/0262; H01L 27/0285; H01L 27/0255; H02H 9/046

USPC ...................................... 327/309–313; 361/56
See application file for complete search history.

(56) References Cited

U.S. PATENT DOCUMENTS

| 7,728,649 | B1 * | 6/2010 | Webb ................... H03K 17/165 327/534 |
| 10,523,002 | B2 * | 12/2019 | Huang ................ H01L 27/0266 |
| 2007/0177317 | A1 * | 8/2007 | Kim ..................... H01L 27/0266 361/56 |
| 2015/0229125 | A1 * | 8/2015 | Kato ...................... H02H 9/046 361/56 |
| 2015/0249334 | A1 * | 9/2015 | Chen ..................... H02H 9/046 361/56 |

OTHER PUBLICATIONS

Infineon LIN Transceiver Data Sheet, TLE7259-3, Rev. 1.0, Aug. 13, 2013; 32 pages.

(Continued)

*Primary Examiner* — Quan Tra

(57) ABSTRACT

A bus interface bus is described. A first logical state is conveyed over the bus by a higher voltage level and a second logical state is conveyed by a lower voltage level. An output stage of the interface includes a power transistor configured to drive the lower voltage level onto the bus to convey the second logical state, and a protective device between the power transistor and the bus. The protective device couples the power transistor to the bus when turned on and limits negative voltage excursions at the power transistor when turned off. A control circuit of the interface is configured to turn on the protective device when the bus voltage is above the lower voltage level and to turn off the protective device when the bus voltage is at or below the lower voltage level.

24 Claims, 20 Drawing Sheets

(56) References Cited

OTHER PUBLICATIONS

NXP Semiconductors Data Sheet, Power system basis chip with high speed CAN and LIN transceivers, MC33907-MC33908D2, Rev. 6.0, Jun. 2019; 123 pages.
Texas Instruments, TLIN1029-Q1 Local Interconnect Network (LIN) Transceiver with Dominant State Timeout, SLLSEY53—Oct. 2017—Revised May 2020; 42 pages.

* cited by examiner

NEGATIVE VOLTAGE PROTECTION FOR BUS INTERFACE DEVICES

CROSS-REFERENCE TO RELATED APPLICATIONS

This application claims the benefit of U.S. Provisional Application No. 63/023,387, filed May 12, 2020, which is incorporated by reference herein in its entirety.

BACKGROUND

LIN (Local Interconnect Network) is a serial network protocol used for communication between components in vehicles. The LIN bus is a single wire, bi-directional bus, used for in-vehicle networks. A transceiver or similar device provides an interface between a microcontroller and the physical LIN bus. Logical values of the microcontroller are driven onto the LIN bus via a 'TxD' input of the LIN interface, where transmit data communicated on the TxD input is converted to a LIN bus signal. The LIN interface also has an 'RxD' output which reads back information from the LIN bus to the microcontroller.

Two logical states, dominant and recessive, are permitted on the LIN bus according to LIN specifications 1.2, 1.3, 2.0, 2.1, 2.2 and 2.2A. In the dominant state, the voltage on the LIN bus is set at or near ground level. In the recessive state, the voltage on the LIN bus is set to a supply voltage. By setting the TxD input of a LIN interface to a logic low level, the interface generates a dominant level on its LIN bus interface pin. The RxD output of the LIN interface reads back the signal on the LIN bus and indicates a dominant LIN bus signal with a logical low signal to the microcontroller. In response to the microcontroller setting the TxD pin of the interface device to a logic high level, the interface sets its LIN bus interface pin to the recessive level. At the same time, the recessive level on the LIN bus is indicated by a logical high level on the RxD output of the interface.

Bipolar transistors were widely used in LIN interfaces for driving the LIN bus. Due to higher costs, bipolar transistors have been replaced over time by less expensive MOSFET (metal-oxide semiconductor field-effect transistor) devices, typically high voltage PMOS devices. High voltage PMOS devices require protection from negative voltages which occur on the LIN bus. Voltages on the LIN bus can range from −40V to +45V. High voltage diodes have been used to protect high voltage PMOS-based drivers from negative voltages on the LIN bus. However, high voltage PMOS devices suffer from turn on of a parasitic PNP device. The LIN specification has slope time requirements for the voltage on the LIN bus, hence slew rate control is needed. Turn on of the parasitic PNP device present in high voltage PMOS-based LIN drivers prevents control of the slew rate and increases substrate noise in the LIN driver chip (die).

Thus, there is a need for improved negative voltage protection for MOSFET-based LIN bus interfaces.

SUMMARY

According to an embodiment of an interface for a bus over which a first logical state is conveyed by a higher voltage level and a second logical state is conveyed by a lower voltage level, the interface comprises: an output stage comprising a power transistor configured to drive the lower voltage level onto the bus to convey the second logical state and a protective device between the power transistor and the bus, the protective device configured to couple the power transistor to the bus when the protective device is turned on and to limit negative voltage excursions at the power transistor when the protective device is turned off; and a control circuit configured to turn on the protective device when the bus voltage is above the lower voltage level and to turn off the protective device when the bus voltage is at or below the lower voltage level.

According to an embodiment of a battery management semiconductor die, the battery management semiconductor die comprises: logic configured to measure one or more parameters associated with charging and/or discharging a battery; and an interface configured to communicate measurement results for the battery via a bus over which a first logical state is conveyed by a higher voltage level and a second logical state is conveyed by a lower voltage level, wherein the interface comprises: an output stage comprising a power transistor configured to drive the lower voltage level onto the bus to convey the second logical state and a protective device between the power transistor and the bus, the protective device configured to couple the power transistor to the bus when the protective device is turned on and to limit negative voltage excursions at the power transistor when the protective device is turned off; and a control circuit configured to turn on the protective device when the bus voltage is above the lower voltage level and to turn off the protective device when the bus voltage is at or below the lower voltage level.

According to an embodiment of a method of interfacing with a bus over which a first logical state is conveyed by a higher voltage level and a second logical state is conveyed by a lower voltage level, the method comprises: driving, via an output stage having a power transistor and a protective device, the lower voltage level onto the bus to convey the second logical state, wherein the protective device is configured to couple the power transistor to the bus when the protective device is turned on and to limit negative voltage excursions at the power transistor when the protective device is turned off; and controlling a voltage at a gate terminal of the protective device such that the protective device turns on when the bus voltage is above the lower voltage level and the protective device turns off when the bus voltage is at or below the lower voltage level.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide negative voltage protection for MOSFET-based bus interfaces such as local interconnect network (LIN) bus interfaces, clock extension peripheral interface (CXPI) bus interfaces, etc. The output (driver) stage of the MOSFET-based bus interface may include, for example, a PMOS power transistor device for driving the voltage level of the bus in accordance with the logical state to be conveyed over the bus. For example, in the case of LIN specifications 1.2, 1.3, 2.0, 2.1, 2.2 and 2.2A, the voltage level driven onto the bus indicates the dominant state or the recessive state. A protective device couples the power transistor of the output stage to the bus when the protective device is turned on and limits negative voltage excursions at the power transistor when the protective device is turned off. The negative voltage protection scheme described herein includes a control circuit for controlling the on/off state of the protective device in a way that limits negative voltage excursions at the power transistor while also avoiding parasitic device turn on within the protective device.

Described next, with reference to the figures, are exemplary embodiments of the improved negative voltage protection scheme. The embodiments are described in the context of a LIN bus. However, the improved negative voltage protection scheme described herein may also be applied to other automotive communication protocols that enable multiplexing between electronic control units (ECUs) such as in automotive body control applications, including steering switch, AC, and instrument panel systems. For example, the interface, bus and transceiver elements described in the following embodiments may be compliant with the CXPI protocol instead of the LIN protocol.

Figure 1:
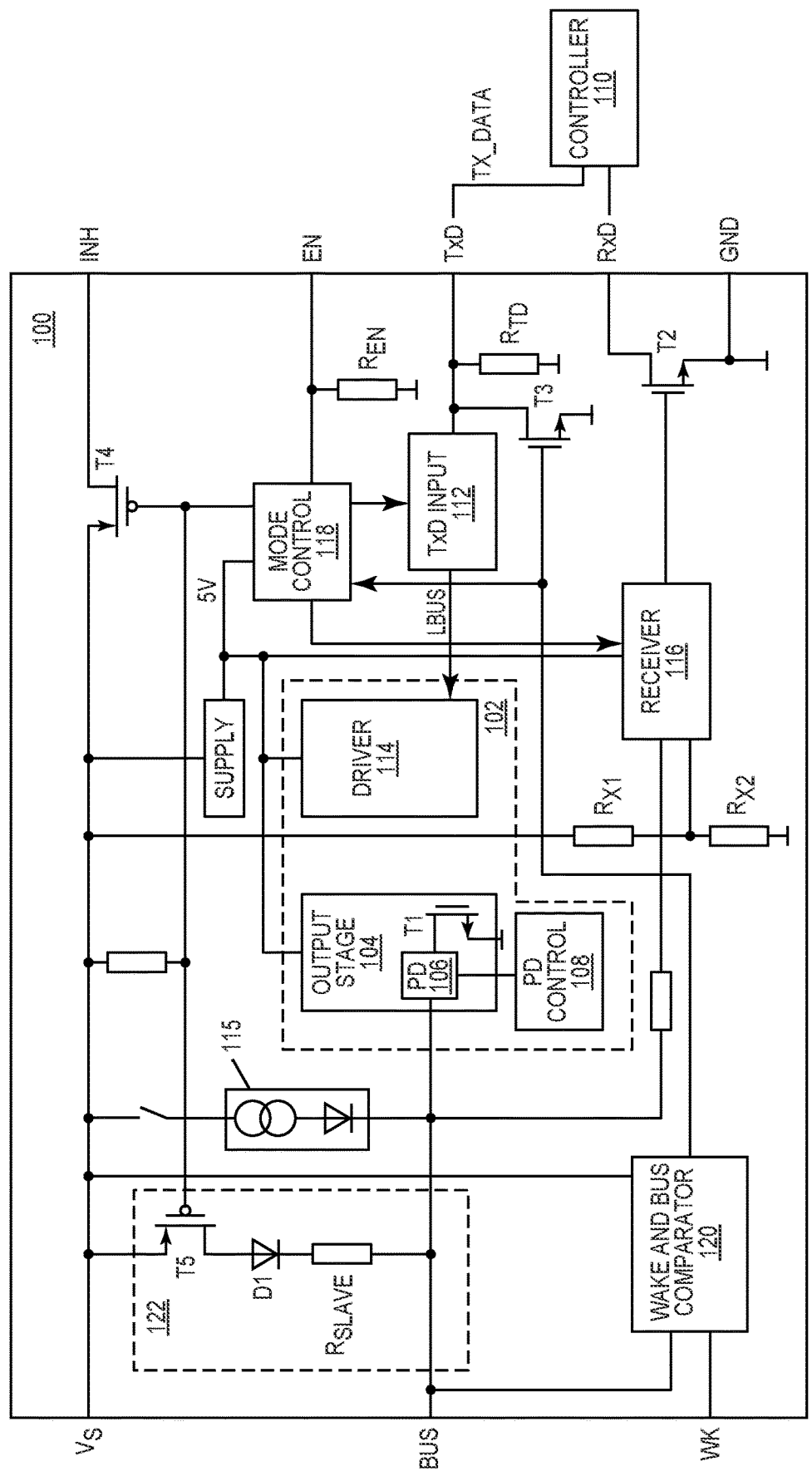
FIG. 1 illustrates a block diagram of an embodiment of a local interconnect network (LIN) transceiver.

FIG. 1 illustrates an embodiment of a LIN transceiver 100. The LIN transceiver 100 includes an interface 102 for a LIN bus over which a first logical state is conveyed by a higher voltage level and a second logical state is conveyed by a lower voltage level. In one embodiment, the interface 102 is compatible with LIN specifications 1.2, 1.3, 2.0, 2.1, 2.2 and 2.2A, the first logical state corresponds to the recessive state defined in LIN specifications 1.2, 1.3, 2.0, 2.1, 2.2 and 2.2A, and the second logical state corresponds to the dominant state defined in LIN specifications 1.2, 1.3, 2.0, 2.1, 2.2 and 2.2A.

Regardless of the specific type of LIN bus, the LIN interface 102 includes an output stage 104 having a power transistor T1 for driving the LIN bus and a protective device 'PD' 106 between the power transistor T1 and the LIN bus. The power transistor T1 drives the higher voltage level onto the LIN bus to convey the first logical state and drives the lower voltage level onto the LIN bus to convey the second logical state.

The protective device 106 couples the power transistor T1 to the LIN bus when the protective device 106 is turned on and limits negative voltage excursions at the power transistor T1 when the protective device 106 is turned off. The LIN interface 102 also includes a control circuit 108 for turning on the protective device 106 when the LIN bus voltage is above the lower voltage level and turning off the protective device 106 when the LIN bus voltage is at or below the lower voltage level.

The LIN transceiver 100 shown in FIG. 1 also includes a LIN bus pin 'Bus' coupled to the output stage 104 of the LIN interface 102. The LIN bus pin Bus is for coupling the LIN transceiver 100 to a LIN bus. A transmit data input pin 'TxD' of the LIN transceiver 100 is for receiving a transmit data stream 'TX_data' from a controller 110 such as a microcontroller. A transmit data input circuit 112 of the LIN transceiver 100 converts the received transmit data stream to a LIN bus signal 'Lbus' provided to a driver circuit 114 of the LIN interface 102. In the case of LIN specifications 1.2, 1.3, 2.0, 2.1, 2.2 and 2.2A, an integrated pull-down device $R_{TD}$ ensures the received transmit data stream is logic low in the dominant state. The LIN transceiver 100 also has a supply input pin 'Vs' for proving a supply voltage vsup such as a battery voltage and a ground pin 'GND'. An internal termination and pull-up current source 110 may couple the supply input pin Vs to the LIN bus pin Bus.

A receive circuit 116 of the LIN transceiver 100 reads back the LIN bus signal from the LIN bus and indicates the logical state of the LIN bus based on the voltage level of the LIN bus signal. The receive circuit 116 is coupled to the supply input pin Vs through a pullup circuit $R_{X1}$, $R_{X2}$. A receive data output pin 'RxD' of the LIN transceiver 100 communicates the logical state of the LIN bus as indicted by the receive circuit 116 to the controller 110 via a driver device T2 which transits the received data stream 'RX_data' to the controller 110.

The LIN transceiver 100 may also have an enable input pin 'EN' for receiving an enable signal. Coupled to the enable input pin EN may be an integrated pull-down device $R_{EN}$ and a circuit 118 for setting the LIN transceiver 100 to a normal operating mode when the signal received at the enable input pin EN is active, e.g., logic high. In the normal operating mode, data from the controller 112 is transmitted to the LIN bus via the TxD pin and the receiver 116 detects the data stream on the LIN bus and forwards the detected data to the RxD output pin.

The LIN transceiver 100 may also have a wake input pin 'WK' that in connection with the state of the LIN bus can be used to place the LIN transceiver 100 in a stand-by mode in which communication on the LIN bus is not permitted. The LIN transceiver 100 may include a comparator circuit 120 for monitoring the state of the wake input pin WK and LIN bus to determine when to place the LIN transceiver 100 in the stand-by mode, and a pull-up device T3 for pulling the transmit data input pin TxD to the supply input pin Vs to indicate the first logical state (e.g., the recessive state as defined in LIN specifications 1.2, 1.3, 2.0, 2.1, 2.2 and 2.2A).

The LIN transceiver 100 may also have an inhibit output pin 'INH' which is a supply related output. The inhibit output pin INH may be used to control an external voltage regulator or to control an external bus termination resistor when the LIN transceiver 100 is used in master node. The inhibit output pin INH is coupled to the supply input Vs through a power device T4. The LIN transceiver 100 may also include a circuit 122 for placing the LIN transceiver 100 is slave mode. The LIN transceiver 100 may be placed in the master mode by connecting a resistor $R_{slave}$ and a reverse diode D1 between the LIN bus pin Bus and the supply input pin Vs or the inhibit output pin INH, e.g., via a switch device T5. Yet further additional circuitry may be included in the LIN transceiver 100.

Figure 2:
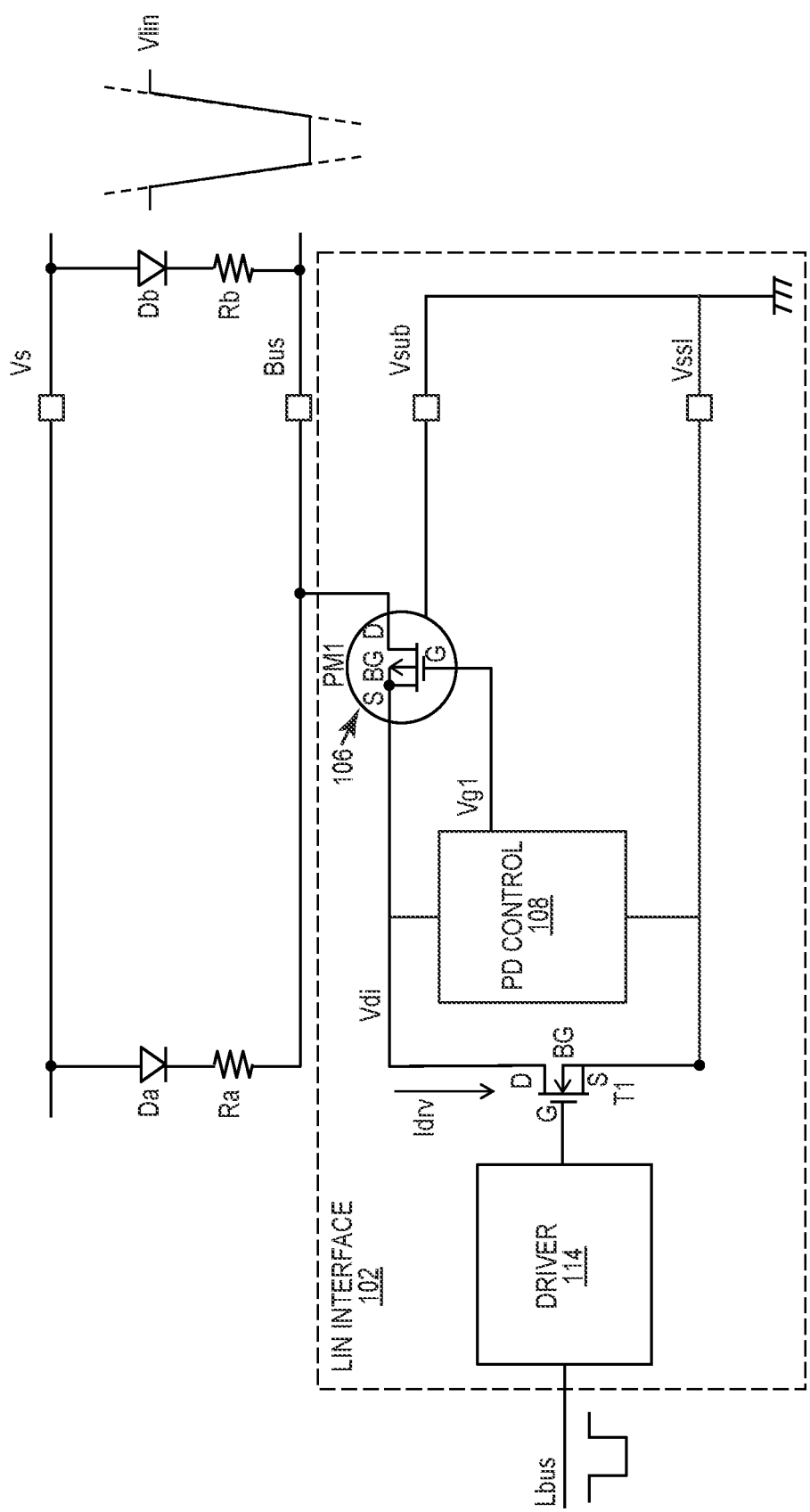
FIG. 2 illustrates a schematic diagram of an interface of the LIN transceiver in more detail.
Figure 3:
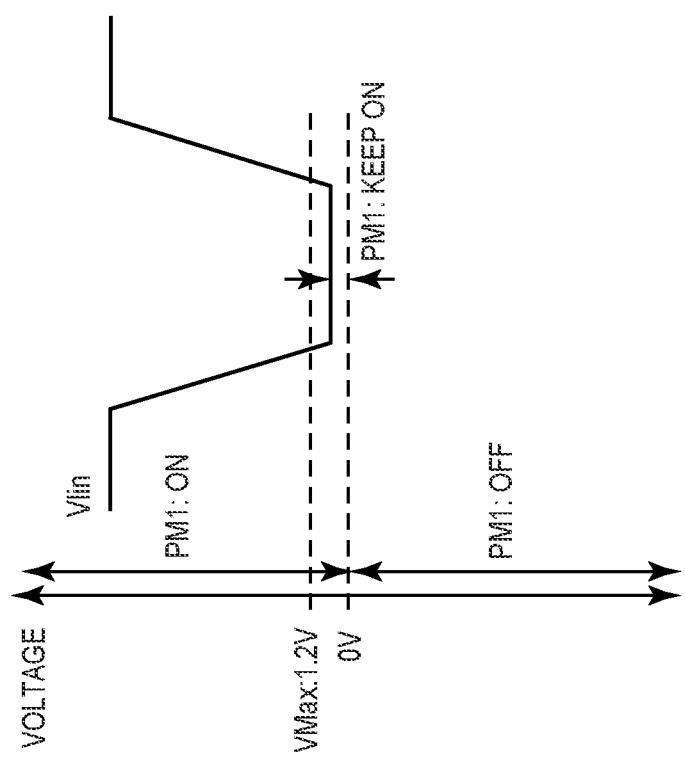
FIG. 3 illustrates various waveforms associated with the operation of the LIN interface shown in FIG. 2.

FIG. 2 illustrates the LIN interface 102 in more detail. According to this embodiment, the supply input pin Vs of the LIN transceiver 100 is connected to the LIN bus pin Bus through a pair of series-connected reverse diodes Da, Db and resistors Ra, Rb, for example. The control circuit 108 of the LIN interface 102 turns off the protective device 106 when the LIN bus voltage 'Vlin' is below a maximum permitted value for the lower voltage level and above 0V and turns on the protective device 106 above this voltage condition. In one embodiment, the maximum permitted value for the lower voltage level is 1.2V as shown in FIG. 3, e.g., as specified in LIN specifications 1.2, 1.3, 2.0, 2.1, 2.2 and 2.2A.

In FIG. 2, the protective device 106 is illustrated as a p-channel transistor device PM1 having a drain terminal 'D' coupled to the LIN bus pin Bus and a source terminal 'S' coupled to the power transistor T1 that drives the LIN bus. For p-channel devices, the source and drain regions are p-doped and the body region is n-doped. The body region 'BG' is at substrate potential 'Vsub' which may be at the same potential as ground reference terminal 'Vssl'. Driver current 'Irdv' flows from the drain D to the source S of the p-channel transistor protective device PM1 when PM1 is turned on by the control circuit 108, and voltage Vdi appears at the drain terminal D of the power transistor T1.

When the LIN bus signal Lbus provided by the transmit data input circuit 114 of the LIN transceiver 100 transitions from a logic high level to a logic low level, the LIN bus voltage Vlin transitions from the first logical state to the second logical state but with a controlled slew rate. When the LIN bus signal Lbus transitions from a logic low level to a logic high level, the LIN bus voltage Vlin transitions from the second logical state to the first logical state also with a controlled slew rate. FIG. 2 indicates the high-to-low and low-to-high slew rates by dashed sloped lines in the upper righthand Vlin waveform. The control circuit 108 of the LIN interface 102 ensures that the protective device 106 does not adversely affect the slew rate control, by avoiding parasitic turn on within the p-channel transistor device PM1.

To this end, and for the p-channel transistor protective device PM1 embodiment shown in FIG. 2, the control circuit 108 drives the gate terminal 'G' of the p-channel transistor device PM1 towards 0V to transition the LIN bus from the first logical state to the second logical state where the voltage 'Vg1' at the gate terminal G of the p-channel transistor device PM1 determines the lower voltage level for the LIN bus for the embodiment illustrated in FIG. 2. For LIN specifications 1.2, 1.3, 2.0, 2.1, 2.2 and 2.2A, this means that the control circuit 108 turns off the p-channel transistor protective device PM1 for LIN bus voltages at or near 0V. For example, the control circuit 108 may turn off the p-channel transistor protective device PM1 between 0V and the maximum voltage 'VMax' permitted for the LIN bus in the dominant state, as shown in FIG. 3. By controlling the protective device 106 in this way, parasitic turn on is avoided within the p-channel transistor protective device PM1 while also limiting negative voltage excursions at the power transistor T1.

Figure 4:
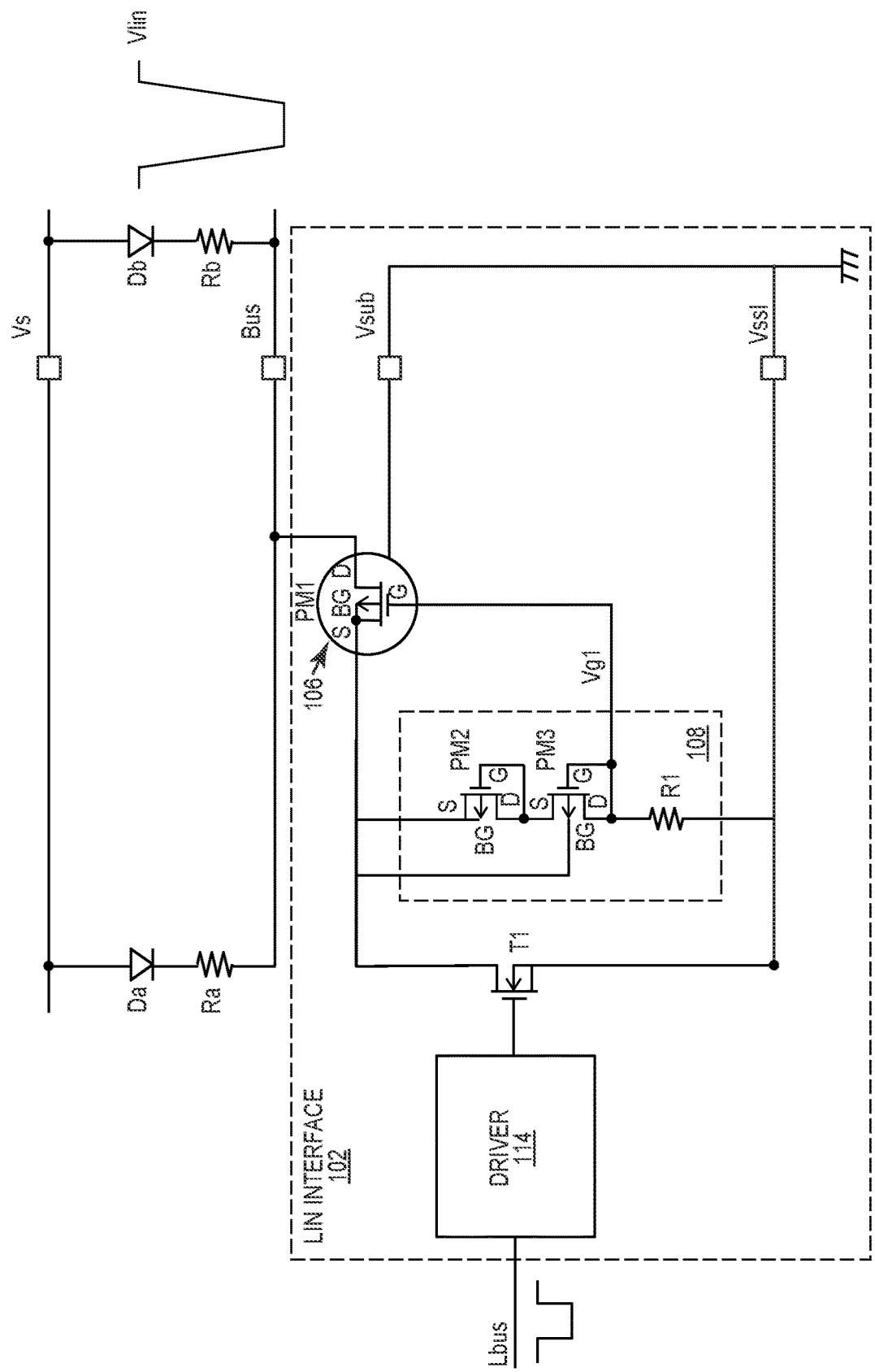
FIGS. 4, 6, 8 and 10 illustrate schematic diagrams of different embodiments of a control circuit included in the LIN interface.

FIG. 4 illustrates the control circuit 108 of the LIN interface 102 in more detail. According to this embodiment, the control circuit 108 includes a series-connected first p-channel transistor device PM2 and second p-channel transistor device PM3 coupled in parallel with the power transistor T1. The source terminal S and body region BG of p-channel transistor device PM2 are coupled to the protective device 106. The drain terminal D and gate terminal G of p-channel transistor device PM2 are coupled to the source terminal S of p-channel transistor device PM3. The body region BG of p-channel transistor device PM3 is coupled to the protective device 106. The gate terminal G of p-channel transistor device PM3 is coupled to both the drain terminal D of p-channel transistor device PM3 and to the gate terminal G of the protective device 106. The control circuit 108 also includes a resistor R1 connected in series between the drain terminal D of p-channel transistor device PM3 and the ground reference terminal Vssl. In the case of LIN specifications 1.2, 1.3, 2.0, 2.1, 2.2 and 2.2A, resistor R1 may be in the megaohm range.

Figure 5:
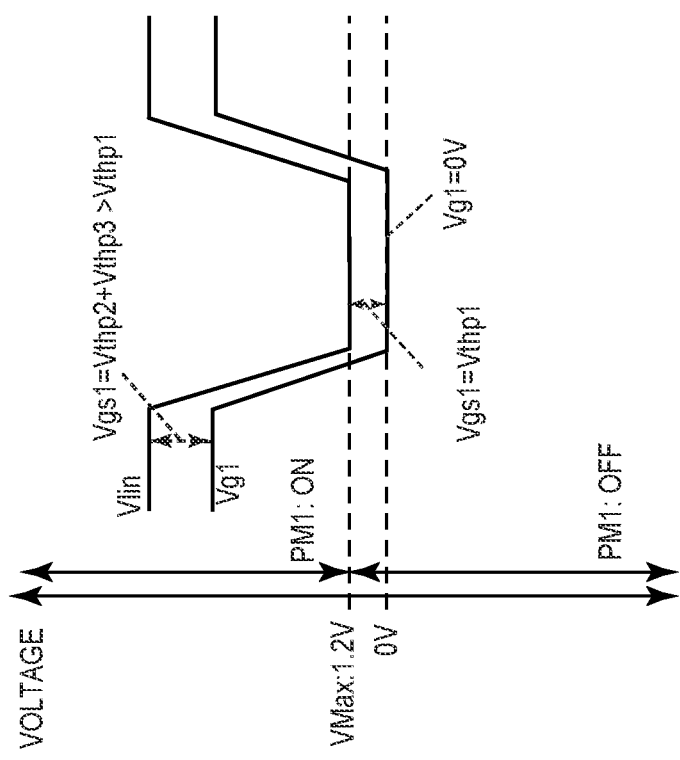
FIGS. 5, 7, 9, and 11 illustrate waveforms associated with the operation of the control circuits shown in FIGS. 4, 6, 8 and 10, respectively.

According to the embodiment of FIG. 4, the voltage level of the second logical state is determined by the threshold voltage 'Vthp1' of the p-channel transistor protective device PM1. In the case of LIN specifications 1.2, 1.3, 2.0, 2.1, 2.2 and 2.2A, this means that the 1.2V maximum level VMax required by the LIN specification for the dominant state may not be satisfied depending on the amount of variation in Vthp1. This is illustrated in FIG. 5 which shows that the difference between the LIN bus voltage Vlin and the gate voltage Vg1 of the p-channel transistor protective device PM1. This difference corresponds to the gate-to-source voltage 'Vgs1' of the p-channel transistor protective device PM1 which is given by:

$$Vgs1 = Vthp2 + Vthp3 > Vthp1 \qquad (1)$$

where Vthp2 is the threshold voltage of p-channel transistor device PM2 and Vthp3 is the threshold voltage of p-channel transistor device PM3.

Figure 6:
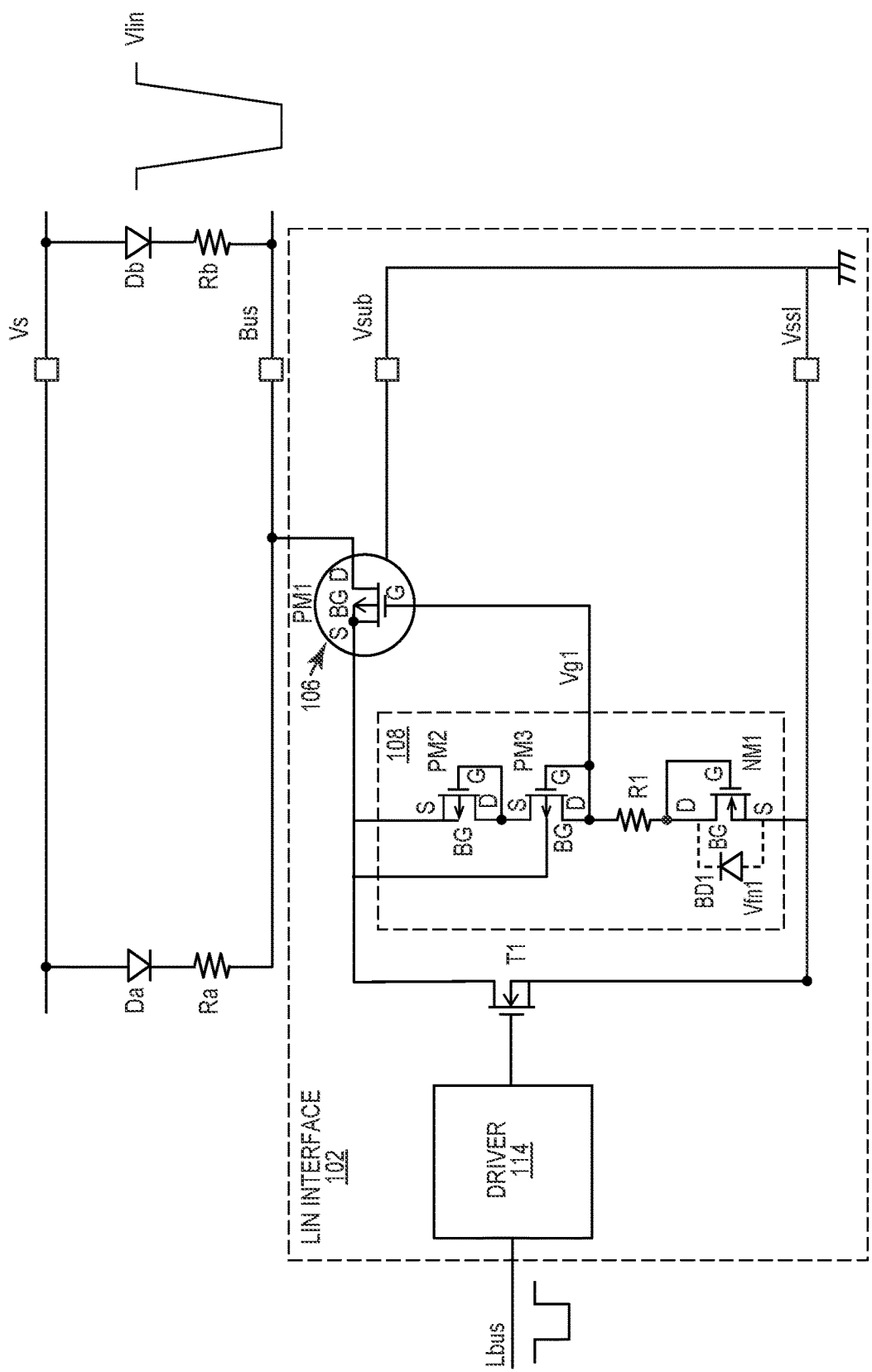

FIG. 6 illustrates another embodiment of the control circuit 108 of the LIN interface 102. The embodiment illustrated in FIG. 6 is similar to the embodiment illustrated in FIG. 4. Different, however, the control circuit 108 further includes a first n-channel transistor device NM1 coupled in series between p-channel transistor device PM3 and the ground reference terminal Vssl. For n-channel devices, the source and drain are n-doped and the body is p-doped. The source terminal S and the body region BG of n-channel transistor device NM1 are coupled to the ground reference terminal Vssl in FIG. 6. The drain terminal D of n-channel transistor device NM1 is coupled to the drain terminal D of p-channel transistor device PM3, e.g., through resistor R1. The gate terminal G of n-channel transistor device NM1 is coupled to the drain terminal D of n-channel transistor device NM1. N-channel transistor device NM1 turns off when the LIN bus voltage Vlin drops below the threshold voltage 'Vthn1' of n-channel transistor device NM1. The control circuit 108 turns off the protective device 106 when the LIN bus voltage Vlin drops below the threshold voltage Vthp1 of the p-channel transistor protective device PM1 less a forward voltage 'Vfn1' of a body diode BD1 of n-channel transistor device NM1.

Figure 7:
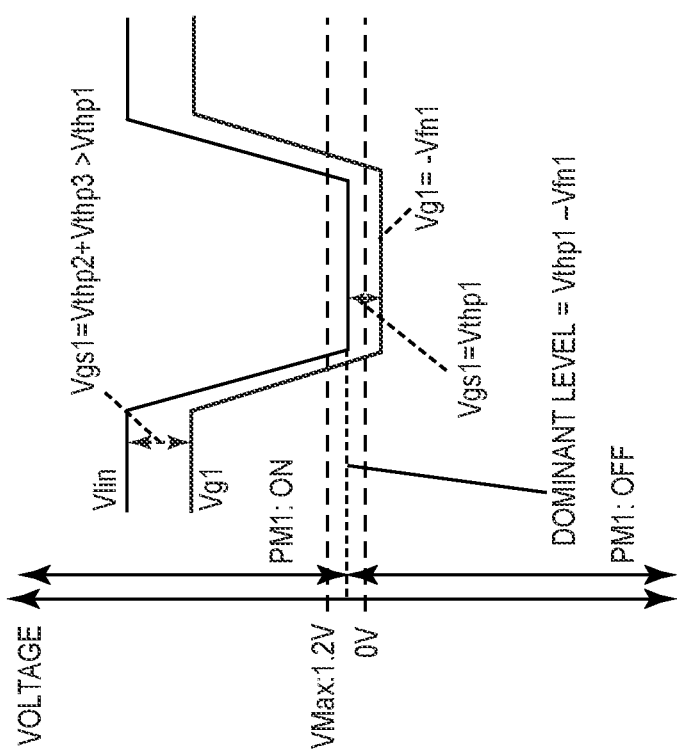

As illustrated in FIG. 7, n-channel transistor device NM1 turns off when the LIN bus voltage Vlin drops below the threshold voltage Vthn1 of n-channel transistor device NM1. When this condition occurs, both p-channel transistor device PM2 and p-channel transistor device PM3 also turn off. Accordingly, the gate voltage Vg1 of the p-channel transistor protective device PM1 may be reduced to −Vfn1 by the gate capacitance of p-channel transistor protective device PM1. In the case of LIN specifications 1.2, 1.3, 2.0, 2.1, 2.2 and 2.2A, this means that the voltage level for the dominant state is maintained below the 1.2V maximum with adequate margin.

Figure 8:
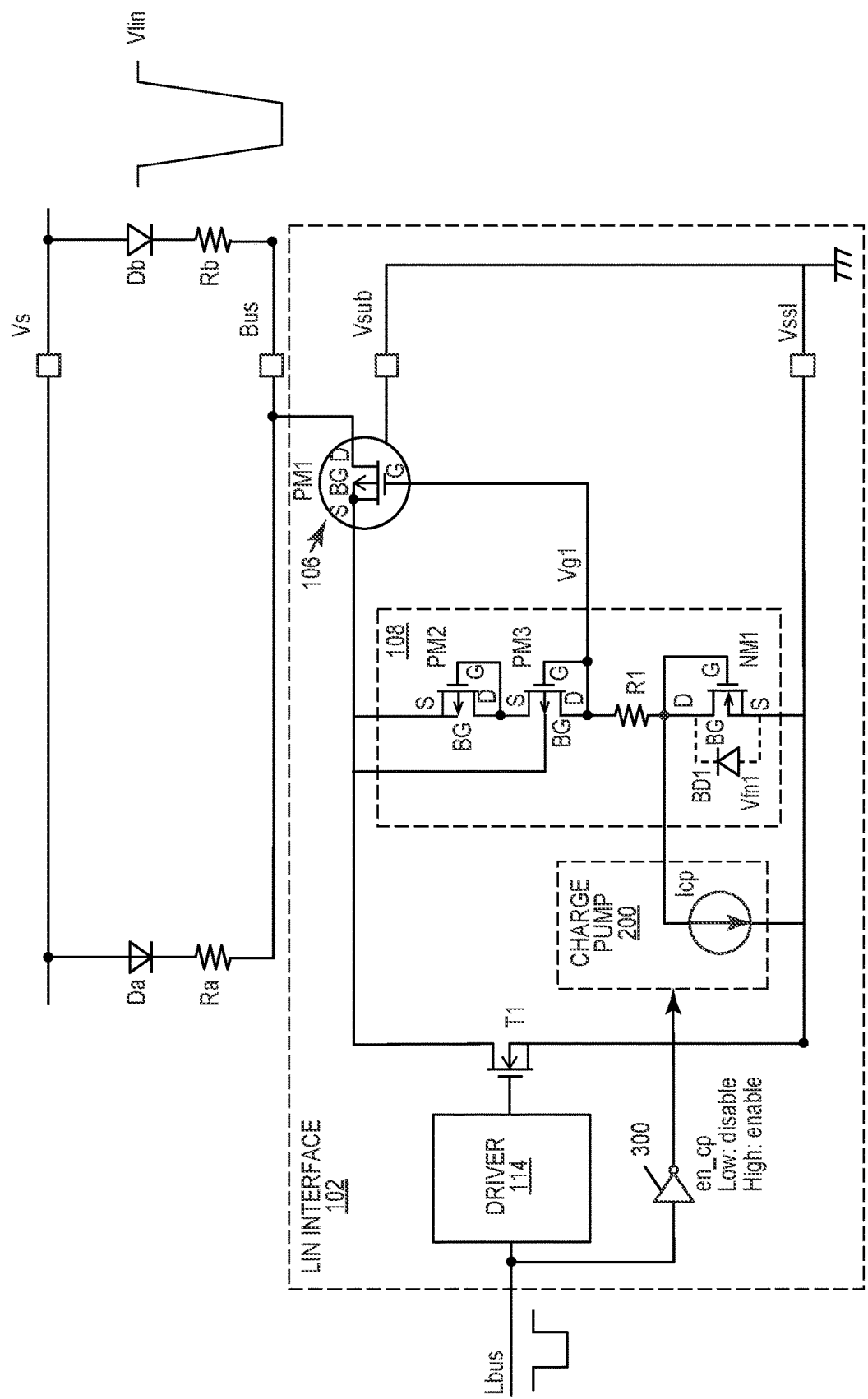
Figure 9:
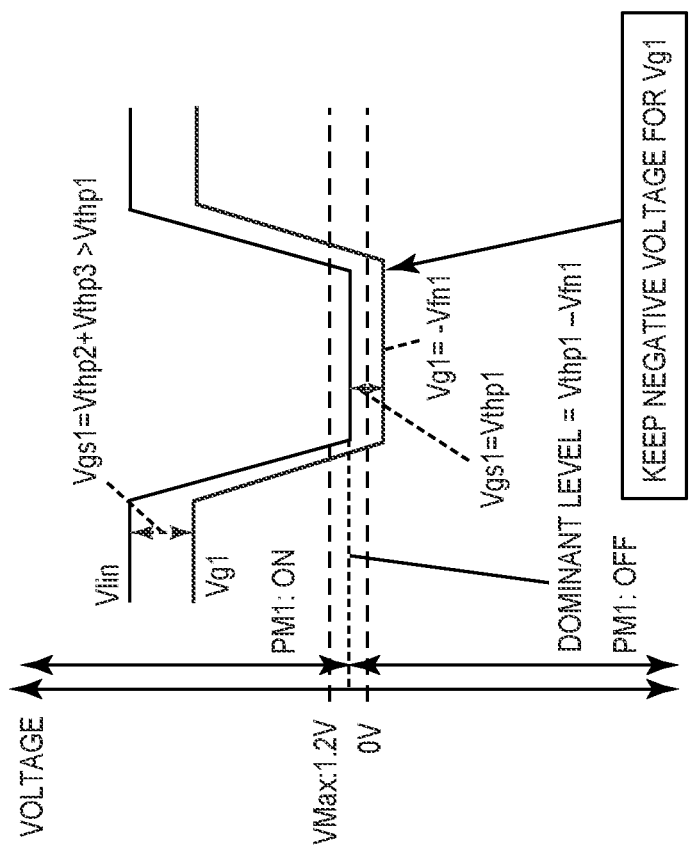

FIG. 8 illustrates another embodiment of the control circuit 108 of the LIN interface 102. The embodiment illustrated in FIG. 8 is similar to the embodiment illustrated in FIG. 6. Different, however, the control circuit 108 further includes a charge pump 200 coupled in parallel with n-channel transistor device NM1. The charge pump 200 is a current source that provides a current 'Icp' which maintains a negative voltage at the gate terminal G of the protective device 106 when the LIN bus is in the second logical state, as shown in FIG. 9. In the case of LIN specifications 1.2, 1.3, 2.0, 2.1, 2.2 and 2.2A, the charge pump 200 is active in the dominant state to keep a negative voltage −Vg1 at the gate terminal G of the p-channel transistor protective device PM1 in accordance with a DC spec of the LIN specification.

Figure 10:
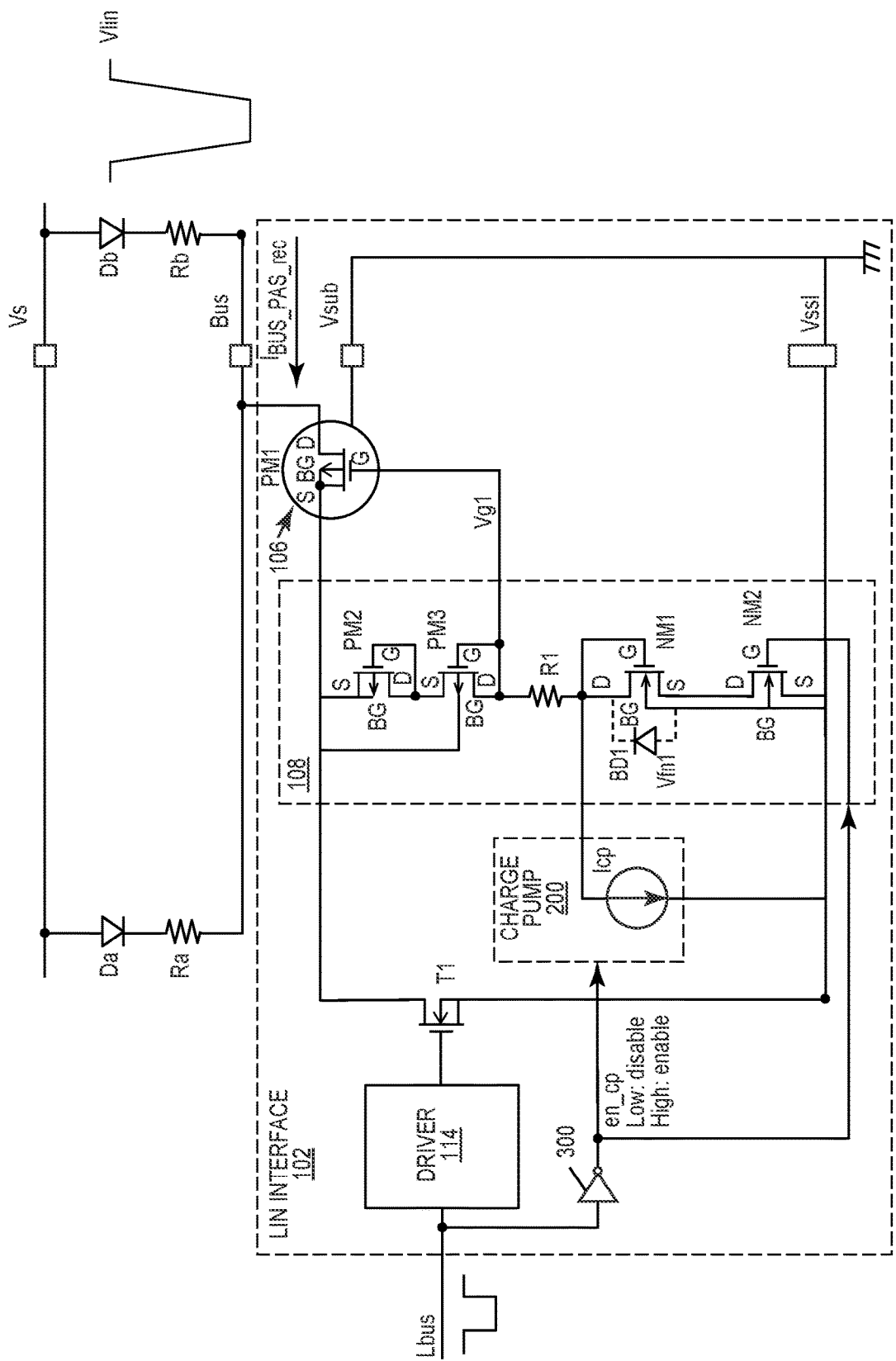
Figure 11:
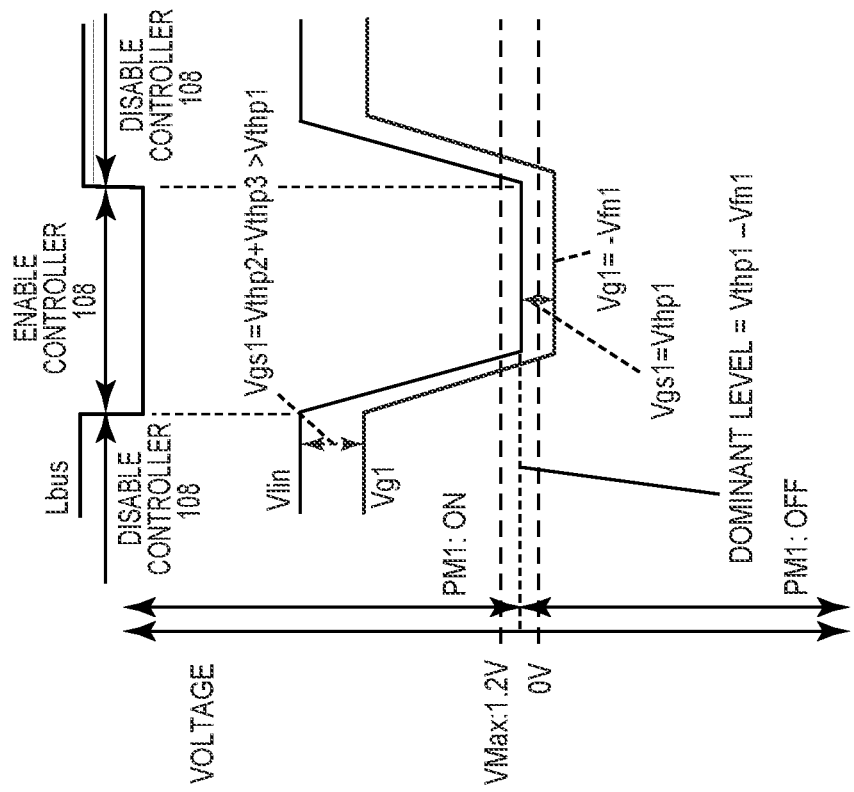

FIG. 10 illustrates another embodiment of the control circuit 108 of the LIN interface 102. The embodiment illustrated in FIG. 8 is similar to the embodiment illustrated in FIG. 6. Different, however, the control circuit 108 further includes a second n-channel transistor device NM2 coupled in series between n-channel transistor device NM1 and the ground reference terminal Vssl. The source terminal S of n-channel transistor device NM1 is coupled to the drain terminal D of n-channel transistor device NM2. The drain terminal D and gate terminal G of n-channel transistor device NM1 are coupled to the drain terminal D of p-channel transistor device PM3. The body region BG of n-channel transistor device NM1 and both the source terminal S and body region BG of second n-channel transistor device NM2 are coupled to the ground reference terminal Vssl. N-channel transistor device NM2 is configured to turn off when the LIN bus is in the first logical state. In one embodiment, the gate terminal G of n-channel transistor device NM2 is controlled by the logical state of the LIN bus such that n-channel transistor device NM2 turns off when the LIN bus is in the first logical state.

For example, the LIN bus signal Lbus provided by the transmit data input circuit 114 of the LIN transceiver 100 may be inverted 300. The inverted signal drives the gate terminal G of n-channel transistor device NM2. Accordingly, n-channel transistor device NM2 turns off when the LIN bus is in the first logical states. In the case of LIN specifications 1.2, 1.3, 2.0, 2.1, 2.2 and 2.2A, this means that n-channel transistor device NM2 is off in the recessive state. LIN specifications 1.2, 1.3, 2.0, 2.1, 2.2 and 2.2A require a maximum current consumption of 20 µA when the output stage 104 and driver 114 are off. Turning off n-channel transistor device NM2 when the LIN bus is in the recessive state reduces current consumption $I_{BUS\_PAS\_rec}$ at the LIN bus pin Bus and thus helps to meet LIN specifications 1.2, 1.3, 2.0, 2.1, 2.2 and 2.2A.

The inverted Lbus signal also forms a charge pump enable signal en_cp for the charge pump 200 coupled in parallel with the series-connected n-channel transistor devices NM1, NM2. The charge pump 200 maintains a negative voltage at the gate terminal G of the protective device 106 when the LIN bus is in the second logical state, as previously explained in connection with FIG. 8. In FIG. 9, when the LIN bus signal Lbus is logic high to indicate the first logical state (e.g., the recessive state in LIN specifications 1.2, 1.3, 2.0, 2.1, 2.2 and 2.2A), the charge pump enable signal en_cp is logic low and thereby disables the charge pump 200.

When the LIN bus signal Lbus is logic low to indicate the second logical state (e.g., the dominant state in LIN specifications 1.2, 1.3, 2.0, 2.1, 2.2 and 2.2A), the charge pump enable signal en_cp is logic high and thereby enables the charge pump 200.

Figure 12:
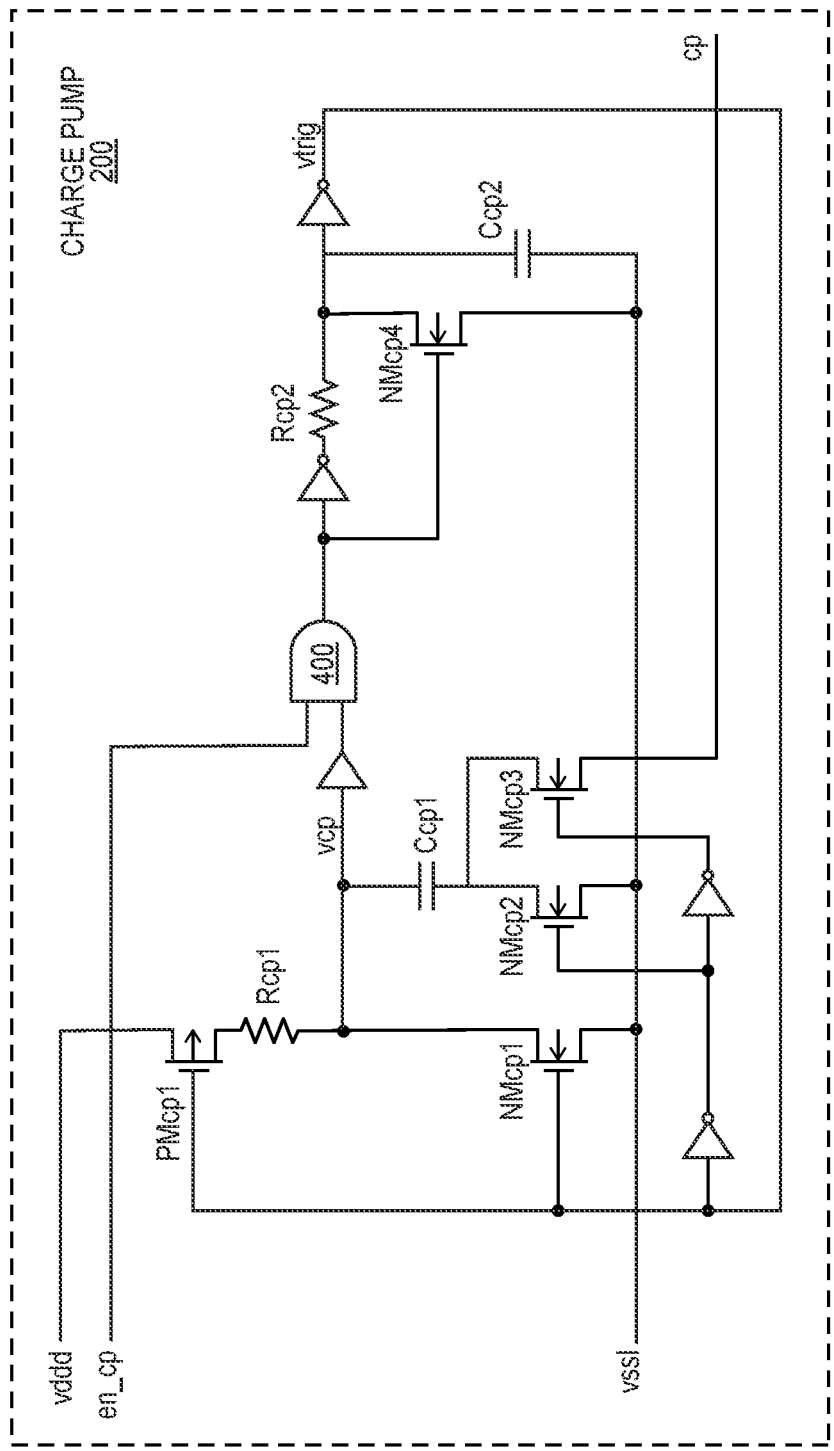
FIG. 12 illustrates a circuit schematic of an embodiment of a charge pump included in the control circuit.

FIG. 12 illustrates an embodiment of the charge pump 200. According to this embodiment, the charge pump 200 a p-channel transistor device PMcp1 coupled to a supply voltage Vddd and an n-channel transistor device NMcp1 coupled to p-channel transistor device PMcp1 by resistor Rcp1. Two additional n-channel transistor devices NMcp2, NMcp3 are coupled to node 'vcp' by capacitor Ccp1. The charge pump enable signal en_cp and the buffered signal at node vcp are input to a logic AND gate 400. An inverted output of the logic AND gate 400 is coupled to the drain of a fourth n-channel transistor device NMcp4 by resistor Rcp2. The gate of n-channel transistor device NMcp4 is coupled to the non-inverted output of the logic AND gate 400. The inverted output of the logic AND gate 400 is inverted again to form a trigger signal 'vtrig' which is coupled to the gate of p-channel transistor device PMcp1 and the gate of n-channel transistor device NMcp1. An inverted version of the trigger signal vtrig drives the gate of n-channel transistor device NMcp2 and is inverted again to drive the gate of n-channel transistor device NMcp3. The source of n-channel transistor device NMcp3 forms a charge node 'cp' which is coupled to the drain terminal of n-channel transistor device NM1 as shown in FIGS. 8 and 10.

Figure 13:
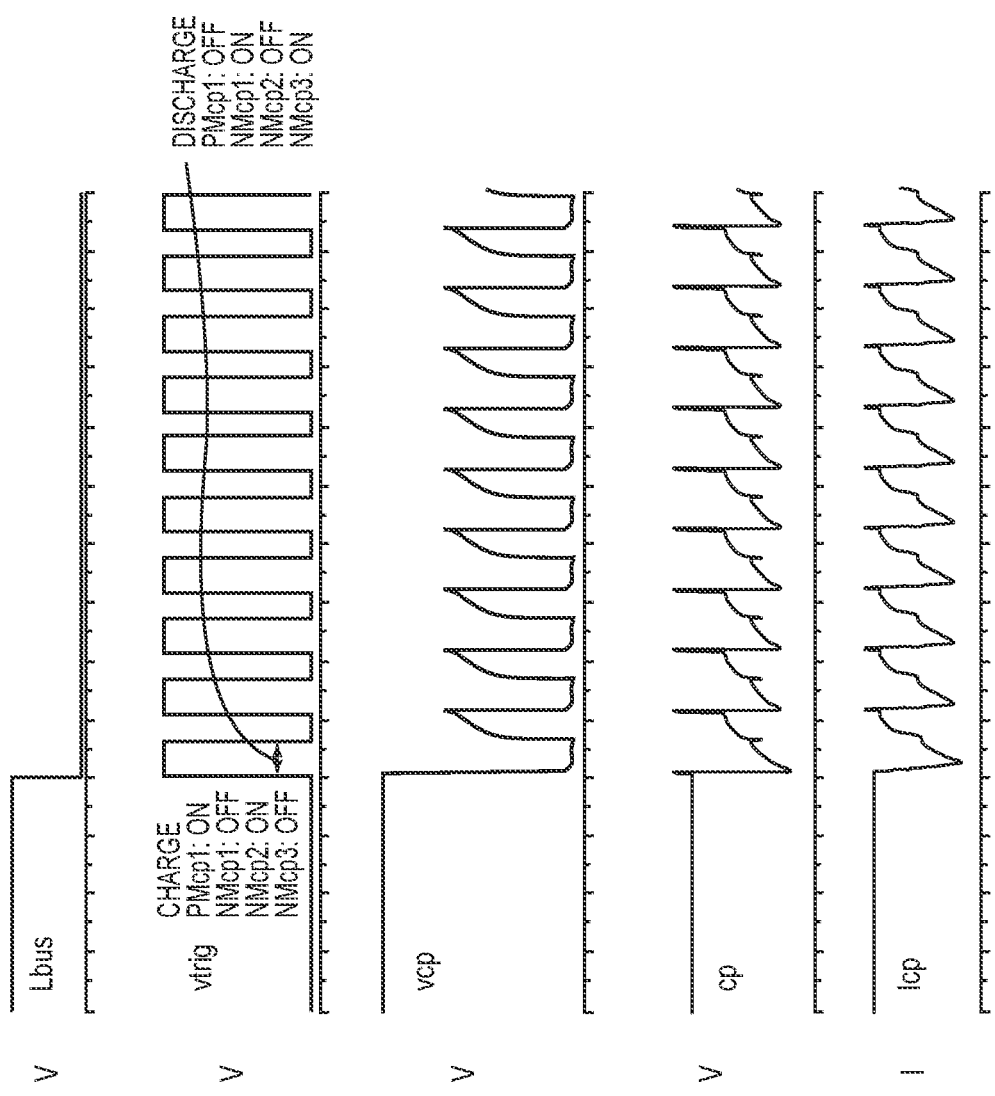
FIG. 13 illustrates various waveforms associated with the operation of the charge pump shown in FIG. 12.

FIG. 13 illustrates various current (I) and voltage (V) waveforms at different nodes of the charge pump 200. The trigger signal vtrig controls the charge/discharge state of the charge pump 200 based on the on/off state of transistor devices PMcp1, NMcp1, NMcp2, and NMcp3 as shown the second waveform from the top of FIG. 13.

Figure 14:
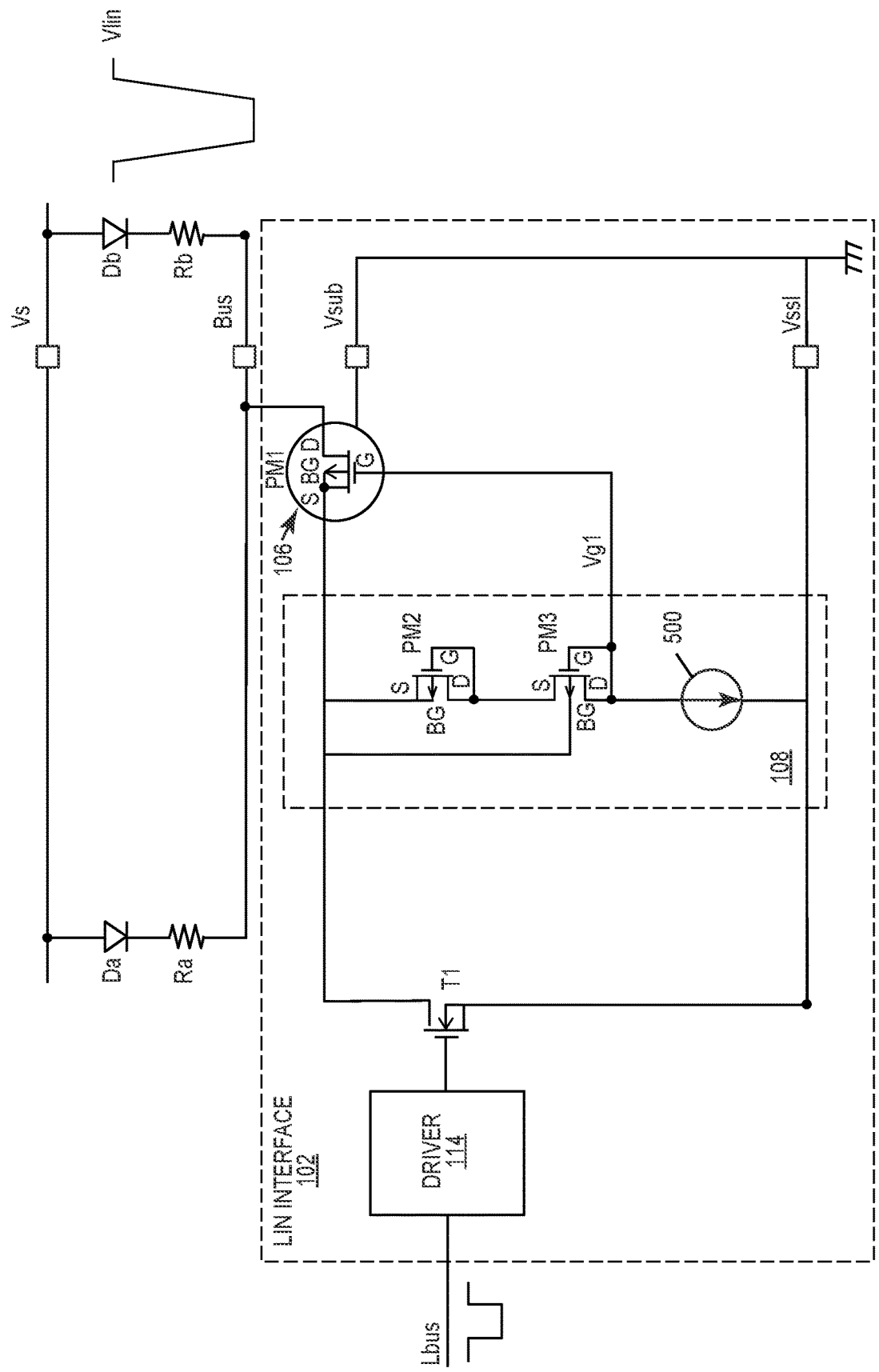
FIGS. 14 through 17 illustrate schematic diagrams of additional embodiments of the control circuit.

FIG. 14 illustrates another embodiment of the control circuit 108 of the LIN interface 102. The embodiment illustrated in FIG. 14 is similar to the embodiment illustrated in FIG. 4. Different, however, the control circuit 108 includes a current source 500 instead of resistor R1 connected in series between the drain terminal D of p-channel transistor device PM3 and the ground reference terminal Vssl.

Figure 15:
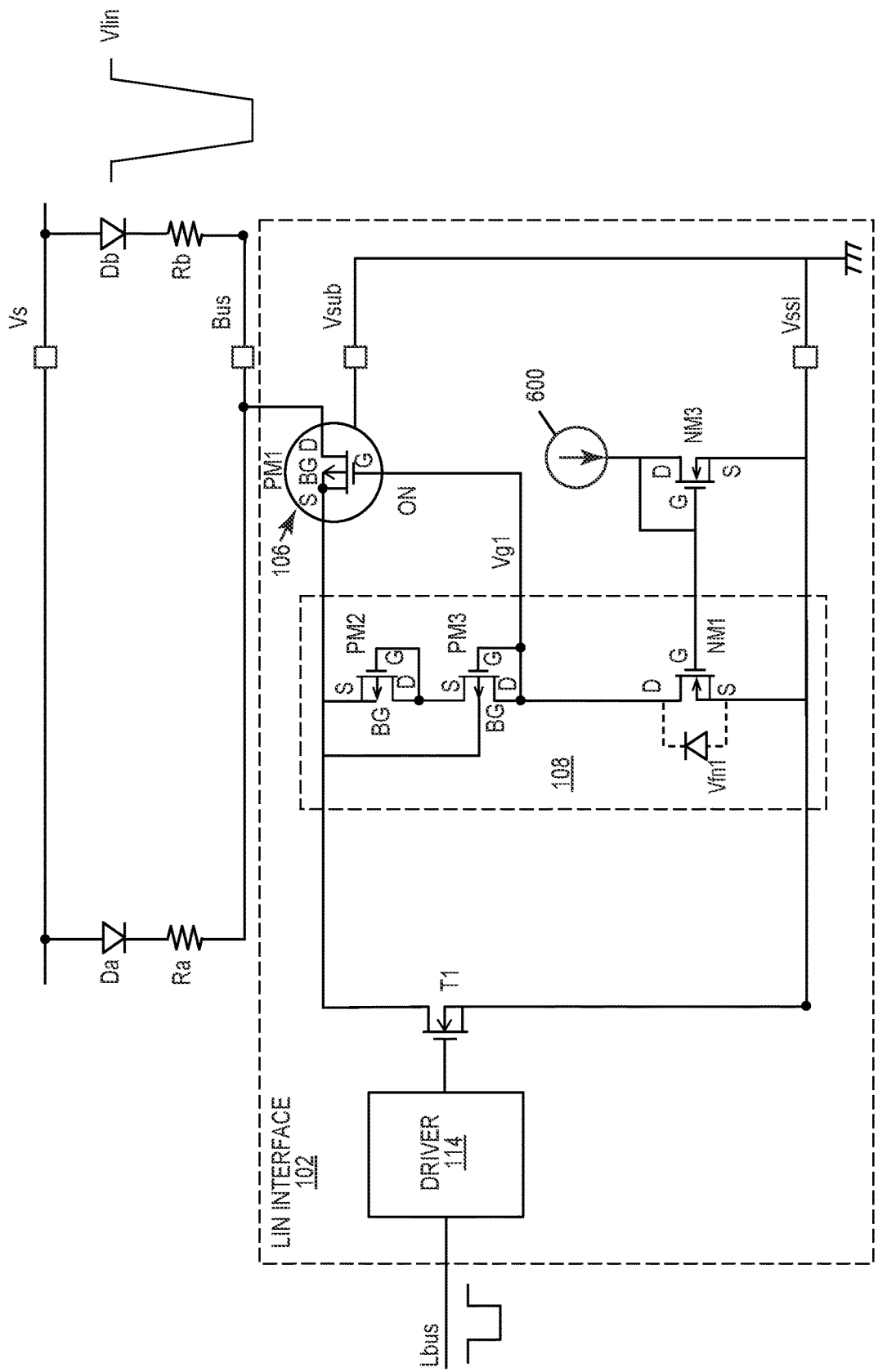

FIG. 15 illustrates another embodiment of the control circuit 108 of the LIN interface 102. The embodiment illustrated in FIG. 15 is similar to the embodiment illustrated in FIG. 6. Different, however, the control circuit 108 includes an additional n-channel transistor device NM3 and a current source 600 coupled to the drain terminal D of n-channel transistor device NM3. Both the source terminal S and the body region BG of n-channel transistor device NM3 are coupled to the ground reference terminal Vssl. The gate terminal G of n-channel transistor device NM3 is coupled to both the drain terminal D of n-channel transistor device NM3 and to the gate terminal G of n-channel transistor device NM1.

Figure 16:
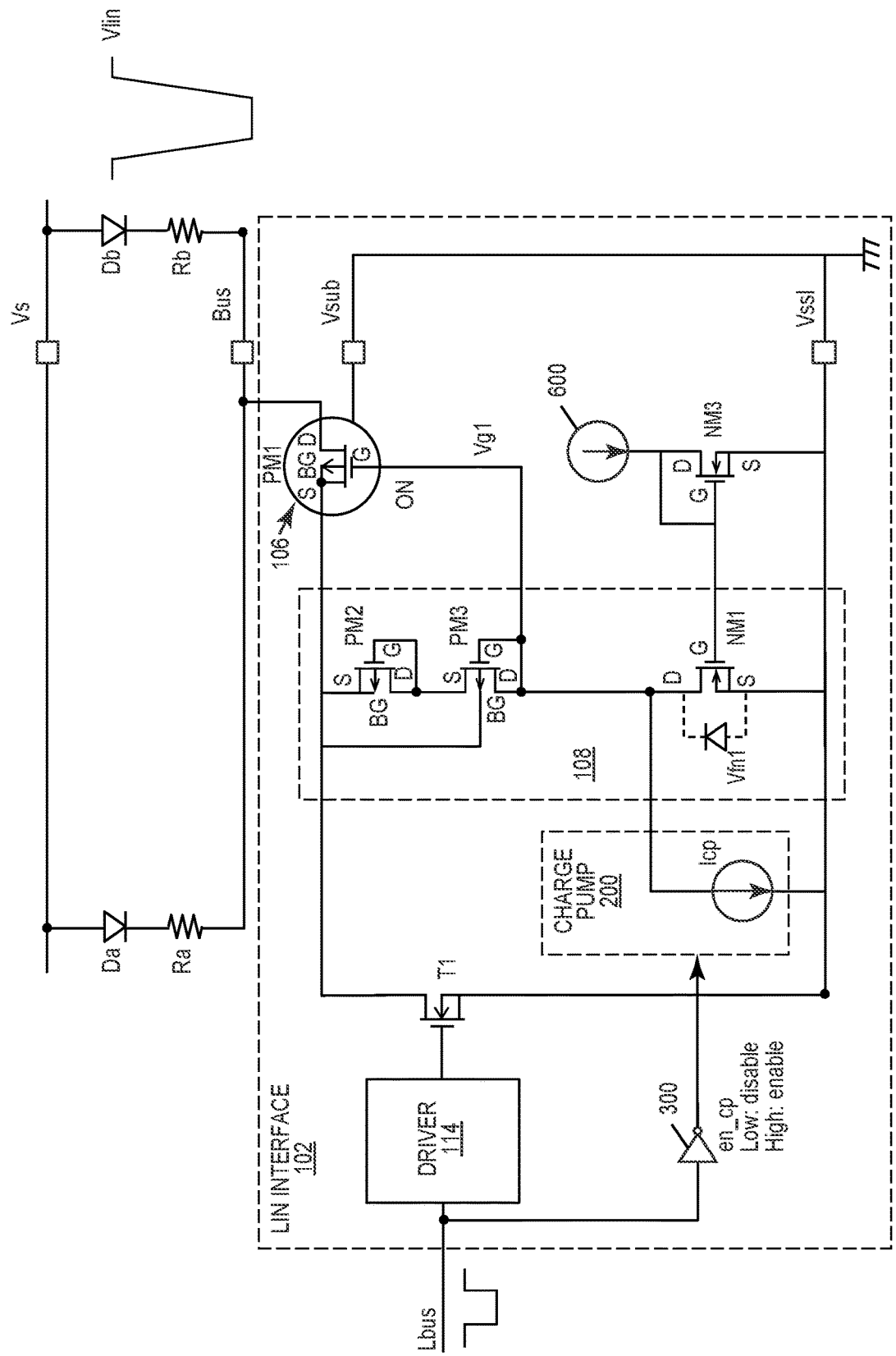

FIG. 16 illustrates another embodiment of the control circuit 108 of the LIN interface 102. The embodiment illustrated in FIG. 16 is similar to the embodiment illustrated in FIG. 15. Different, however, the control circuit 108 further includes a charge pump 200 coupled in parallel with n-channel transistor device NM1. As explained in connection with FIGS. 8 and 10, the charge pump 200 maintains a negative voltage at the gate terminal G of the protective device 106 when the LIN bus is in the second logical state.

Figure 17:
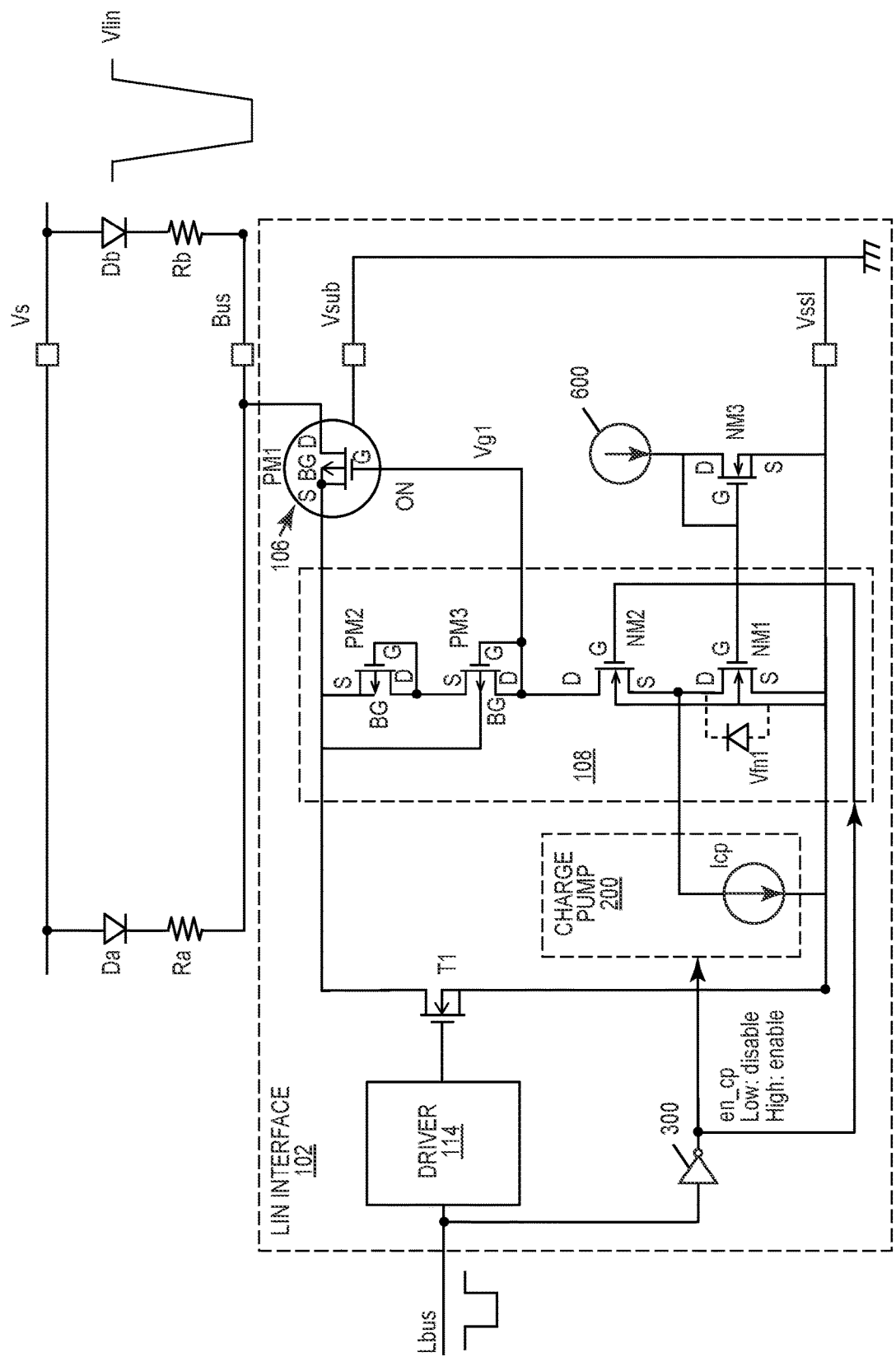

FIG. 17 illustrates another embodiment of the control circuit 108 of the LIN interface 102. The embodiment illustrated in FIG. 17 is similar to the embodiment illustrated in FIG. 16. Different, however, the control circuit 108 further includes an additional n-channel transistor device NM2 coupled in series between n-channel transistor device NM1 and p-channel transistor device PM3. N-channel transistor device NM2 turns off when the LIN bus is in the first logical state.

Figure 18:
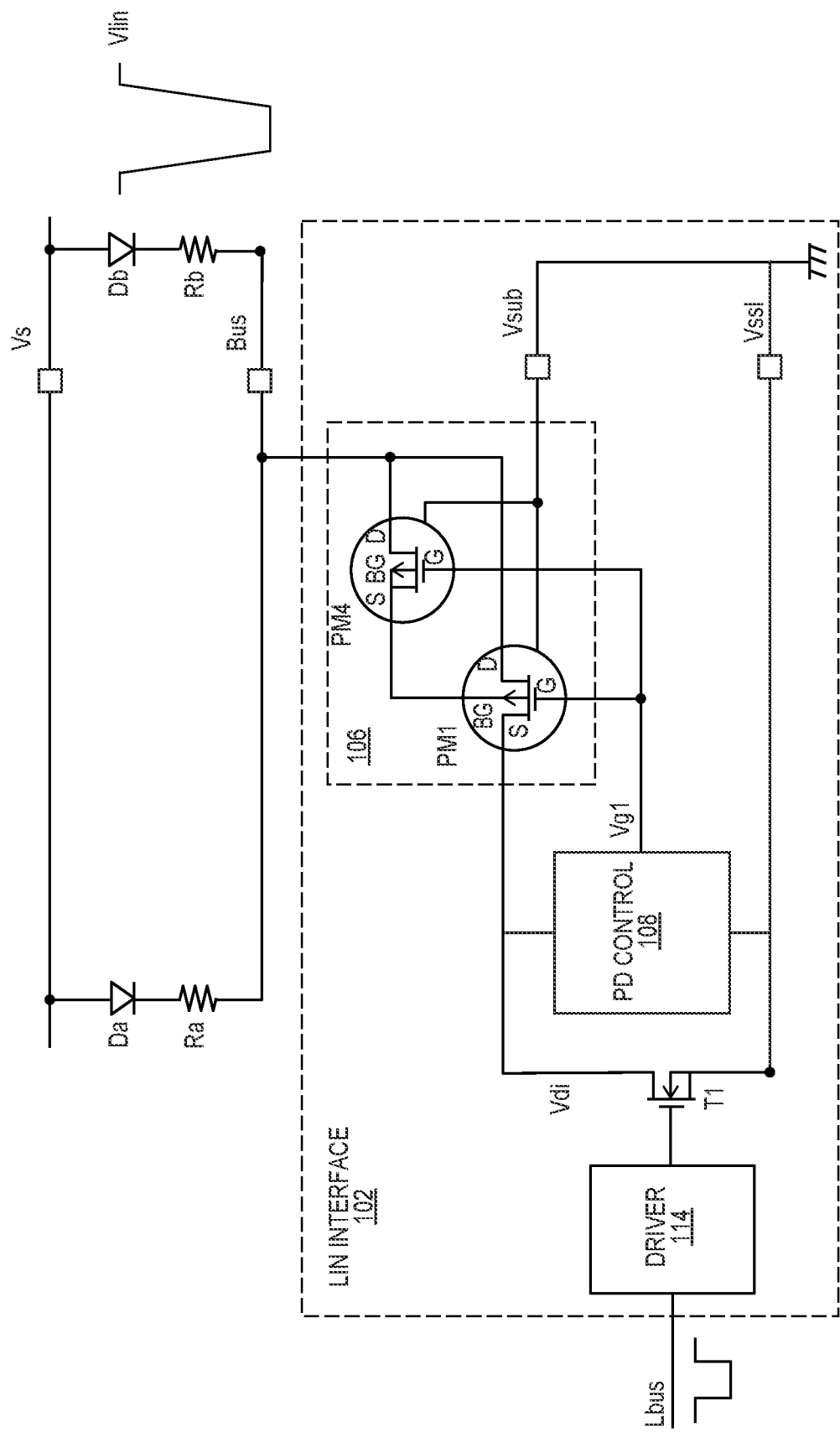
FIG. 18 illustrates a schematic diagram of an embodiment of a protective device included in the LIN interface.

FIG. 18 illustrates another embodiment of the protective device 106 of the LIN interface 102. According to this embodiment, the protective device 106 includes p-channel transistor device PM1 monolithically integrated with another p-channel transistor device PM4 such that the p-channel transistor devices PM1, PM4 share a common body region. The source terminal S of p-channel transistor device PM1 is coupled to the power transistor T1. The drain terminal D of p-channel transistor device PM1 and the drain terminal of p-channel transistor device PM4 are coupled to the LIN bus pin Bus. The source terminal S of p-channel transistor device PM4 is coupled to the common body region. The gate terminal G of p-channel transistor device PM1 and the gate terminal of p-channel transistor device PM4 are coupled to the control circuit 108 and both have the same gate voltage Vg1.

Figure 19:
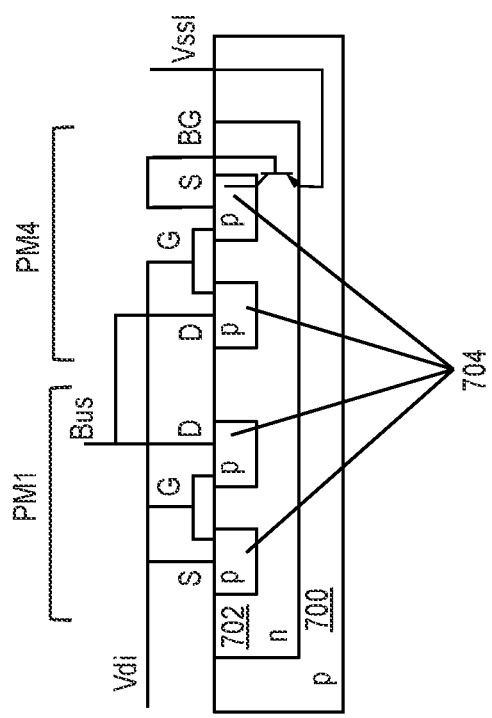
FIG. 19 illustrates a partial cross-sectional of a semiconductor substrate in which p-channel transistor devices of the protective device share a common body region.

FIG. 19 illustrates a partial cross-sectional of a semiconductor substrate 700 in which p-channel transistor devices PM1, PM4 of the protective device 106 share a common body region 702. The semiconductor substrate 700 is doped p-type, the common body region 702 is doped n-type, and the source and drain regions 704 of the p-channel transistor devices PM1, PM4 are doped p-type. According to this embodiment, the parasitic PNP device shown in FIG. 19 does not activate even though the body region BG/702 of p-channel transistor device PM4 is floating. In this case, the voltage level for the second logical state (e.g., the dominant state in LIN specifications 1.2, 1.3, 2.0, 2.1, 2.2 and 2.2A) is improved by controlling the gate terminal G of p-channel transistor device PM1 and the gate terminal G of p-channel transistor device PM4.

Figure 20:
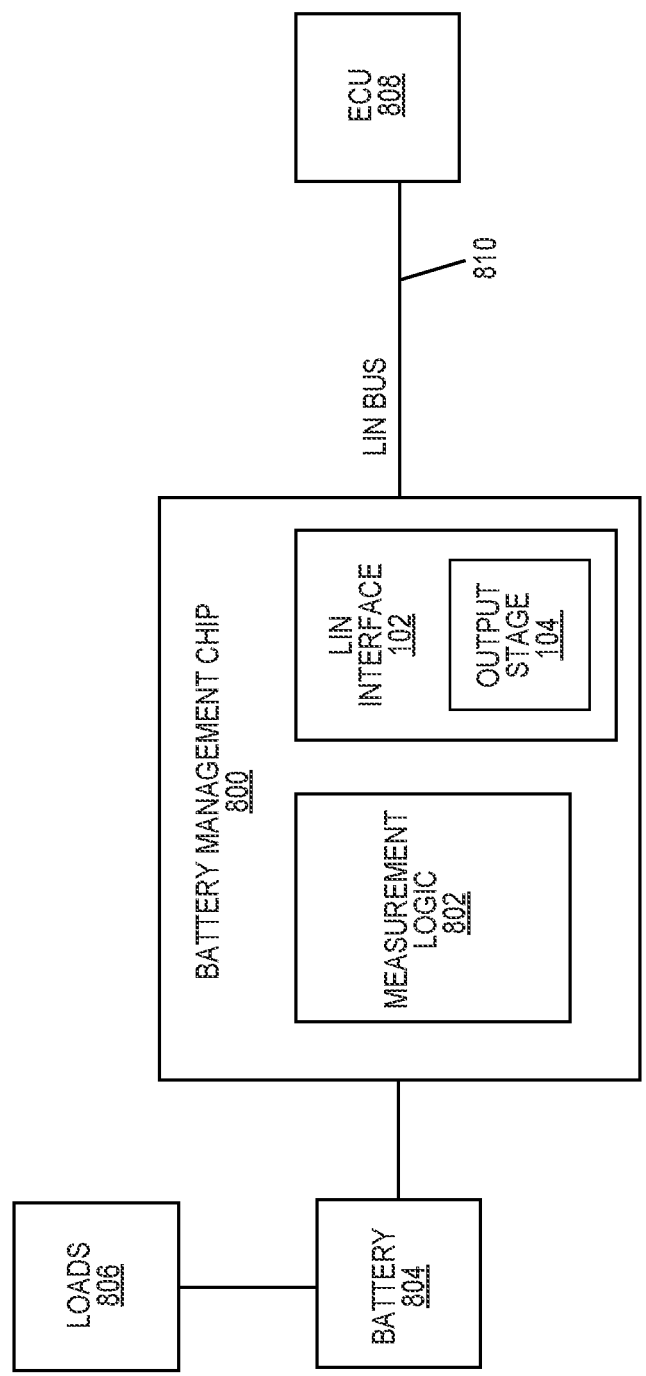
FIG. 20 illustrates a block diagram of an embodiment of a battery management semiconductor die (chip) that includes the LIN interface.

FIG. 20 illustrates an embodiment of a battery management semiconductor die 800 (chip) that includes the LIN interface 102 described herein. The battery management semiconductor die 800 also includes logic 802 such as analog and/or digital circuitry for measuring one or more parameters associated with charging and/or discharging a battery 804 which powers one or more electrical loads 806. For example, the measurement logic 802 may include one or more current sensors, voltage sensors, temperature sensors, etc. The LIN interface 102 communicates measurement results for the battery 804 to an electronic control unit (ECU) 808 such as a microcontroller via a LIN bus 810 over which a first logical state is conveyed by a higher voltage level and a second logical state is conveyed by a lower voltage level. As previously explained herein, the LIN interface 102 includes an output stage 104 having a power transistor T1 (not shown in FIG. 20) for driving the lower voltage level onto the LIN bus 810 to convey the second logical state and a protective device 106 (not shown in FIG. 20) between the power transistor T1 and the LIN bus 810. The protective device 106 couples the power transistor T1 to the LIN bus 810 when the protective device 106 is turned on and limits negative voltage excursions at the power transistor T2 when the protective device 106 is turned off. The LIN interface 102 also includes a control circuit 108 (not shown in FIG. 20) that turns on the protective device 106 when the LIN bus voltage is above the lower voltage level and turns off the protective device 106 when the LIN bus voltage is at or below the lower voltage level.

As previously explained herein, the improved negative voltage protection scheme may be applied to automotive communication protocols other than LIN. For example, the interface, bus and transceiver elements described in the preceding embodiments may be compliant with the CXPI protocol instead of the LIN protocol.

Although the present disclosure is not so limited, the following numbered examples demonstrate one or more aspects of the disclosure.

Example 1. An interface for a bus over which a first logical state is conveyed by a higher voltage level and a second logical state is conveyed by a lower voltage level, the interface comprising: an output stage comprising a power transistor configured to drive the lower voltage level onto the bus to convey the second logical state and a protective device between the power transistor and the bus, the protective device configured to couple the power transistor to the bus when the protective device is turned on and to limit negative voltage excursions at the power transistor when the protective device is turned off; and a control circuit configured to turn on the protective device when the bus voltage is above the lower voltage level and to turn off the protective device when the bus voltage is at or below the lower voltage level.

Example 2. The interface of example 1, wherein the control circuit is configured to turn off the protective device when the bus voltage is below a maximum permitted value for the lower voltage level and above 0V.

Example 3. The interface of example 1 or 2, wherein the control circuit is configured to drive a gate terminal of the protective device towards 0V to transition the bus from the first logical state to the second logical state, and wherein the voltage at the gate terminal of the protective device determines the lower voltage level for the bus.

Example 4. The interface of any of examples 1 through 3, wherein the control circuit comprises a series-connected first p-channel transistor device and second p-channel transistor device coupled in parallel with the power transistor.

Example 5. The interface of example 4, wherein: a source terminal and a body region of the first p-channel transistor device are coupled to the protective device; a drain terminal and a gate terminal of the first p-channel transistor device are coupled to a source terminal of the second p-channel transistor device; a body region of the second p-channel transistor device is coupled to the protective device; and a gate terminal of the second p-channel transistor device is coupled to a drain terminal of the second p-channel transistor device and to a gate terminal of the protective device.

Example 6. The interface of example 4 or 5, wherein: the control circuit further comprises a first n-channel transistor device coupled in series between the second p-channel transistor device and ground; the first n-channel transistor device is configured to turn off when the bus voltage drops below a threshold voltage of the first n-channel transistor device; and the control circuit is configured to turn off the protective device when the bus voltage drops below a threshold voltage of the protective device less a forward voltage of a body diode of the first n-channel transistor device.

Example 7. The interface of example 6, wherein: a source terminal and a body region of the first n-channel transistor device are coupled to ground; a drain terminal of the first n-channel transistor device is coupled to a drain terminal of the second p-channel transistor device; and a gate terminal of the first n-channel transistor device is coupled to the drain terminal of the first n-channel transistor device.

Example 8. The interface of example 6 or 7, wherein: the control circuit further comprises a charge pump coupled in parallel with the first n-channel transistor device; and the charge pump is configured to maintain a negative voltage at the gate terminal of the protective device when the bus is in the second logical state.

Example 9. The interface of any of examples 6 through 8, wherein: the control circuit further comprises a second n-channel transistor device coupled in series between the first n-channel transistor device and ground; the second n-channel transistor device is configured to turn off when the bus is in the first logical state.

Example 10. The interface of example 9, wherein: a source terminal of the first n-channel transistor device is coupled to a drain terminal of the second n-channel transistor device; a drain terminal and a gate terminal of the first n-channel transistor device are coupled to a drain terminal of the second p-channel transistor device; a body region of the first n-channel transistor device and both a source terminal and a body region of the second n-channel transistor device are coupled to ground; and a gate terminal of the second n-channel transistor device is controlled by the logical state of the bus such that the second n-channel transistor device turns off when the bus is in the first logical state.

Example 11. The interface of example 9 or 10, wherein: the control circuit further comprises a charge pump coupled in parallel with the series-connected first n-channel transistor device and second n-channel transistor device; and the charge pump is configured to maintain a negative voltage at the gate terminal of the protective device when the bus is in the second logical state.

Example 12. The interface of any of examples 6 through 11, wherein the control circuit further comprises a resistor connected in series between a drain terminal of the second p-channel transistor device and a drain terminal of the first n-channel transistor device.

Example 13. The interface of any of examples 6 through 12, wherein the control circuit further comprises a second n-channel transistor device and a current source coupled to a drain terminal of the second n-channel transistor device.

Example 14. The interface of example 13, wherein: both a source terminal and a body region of the second n-channel transistor device are coupled to ground; and a gate terminal of the second n-channel transistor device is coupled to both a drain terminal of the second n-channel transistor device and to a gate terminal of the first n-channel transistor device.

Example 15. The interface of example 13 or 14, wherein: the control circuit further comprises a charge pump coupled in parallel with the first n-channel transistor device; and the charge pump is configured to maintain a negative voltage at the gate terminal of the protective device when the bus is in the second logical state.

Example 16. The interface of example 15, wherein: the control circuit further comprises a third n-channel transistor device coupled in series between the first n-channel transistor device and the second p-channel transistor device; and the third n-channel transistor device is configured to turn off when the bus is in the first logical state.

Example 17. The interface of any of examples 4 through 16, wherein the control circuit further comprises a current source connected in series between a drain terminal of the second p-channel transistor device and ground.

Example 18. The interface of any of examples 1 through 17, wherein: the protective device comprises a p-channel transistor device having a drain terminal coupled to the bus and a source terminal coupled to the power transistor; the control circuit is configured to drive a gate terminal of the p-channel transistor device towards 0V to transition the bus from the first logical state to the second logical state; and wherein the voltage at the gate terminal of the p-channel transistor device determines the lower voltage level for the bus.

Example 19. The interface of any of examples 1 through 18, wherein: the protective device comprises a first p-channel transistor device monolithically integrated with a second p-channel transistor device such that the first p-channel transistor device and the second p-channel transistor device share a common body region; a source terminal of the first p-channel transistor device is coupled to the power transistor; a drain terminal of the first p-channel transistor device and a drain terminal of the second p-channel transistor device are coupled to the bus; a source terminal of the second p-channel transistor device is coupled to the common body region; and a gate terminal of the first p-channel transistor device and a gate terminal of the second p-channel transistor device are coupled to the control circuit.

Example 20. The interface of any of examples 1 through 19, wherein the bus is a local interconnect network (LIN) bus.

Example 21. The interface of any of examples 1 through 19, wherein the bus is a clock extension peripheral interface (CXPI) bus.

Example 22. A transceiver comprising the interface of any of examples 1 through 21, the transceiver further comprising: a first pin coupled to the output stage and configured to be coupled to the bus; a second pin configured to receive a transmit data stream from a controller; a transmit circuit configured to convert the received transmit data stream to a bus signal provided to the interface; a receive circuit configured to read back the bus signal from the bus and indicate the logical state of the bus based on the voltage level of the bus signal; and a third pin configured to communicate the logical state of the bus as indicted by the receive circuit to the controller.

Example 23. A battery management semiconductor die, comprising: logic configured to measure one or more parameters associated with charging and/or discharging a battery; and an interface configured to communicate measurement results for the battery via a bus over which a first logical state is conveyed by a higher voltage level and a second logical state is conveyed by a lower voltage level, wherein the interface comprises: an output stage comprising a power transistor configured to drive the lower voltage level onto the bus to convey the second logical state and a protective device between the power transistor and the bus, the protective device configured to couple the power transistor to the bus when the protective device is turned on and to limit negative voltage excursions at the power transistor when the protective device is turned off; and a control circuit configured to turn on the protective device when the bus voltage is above the lower voltage level and to turn off the protective device when the bus voltage is at or below the lower voltage level.

Example 24. A method of interfacing with a bus over which a first logical state is conveyed by a higher voltage level and a second logical state is conveyed by a lower voltage level, the method comprising: driving, via an output stage having a power transistor and a protective device, the lower voltage level onto the bus to convey the second logical state, wherein the protective device is configured to couple the power transistor to the bus when the protective device is turned on and to limit negative voltage excursions at the power transistor when the protective device is turned off; and controlling a voltage at a gate terminal of the protective device such that the protective device turns on when the bus voltage is above the lower voltage level and the protective device turns off when the bus voltage is at or below the lower voltage level.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An interface for a bus over which a first logical state is conveyed by a higher voltage level and a second logical state is conveyed by a lower voltage level, the interface comprising:
    an output stage comprising a power transistor configured to drive the lower voltage level onto the bus to convey the second logical state and a protective device between the power transistor and the bus, the protective device configured to couple the power transistor to the bus when the protective device is turned on and to limit negative voltage excursions at the power transistor when the protective device is turned off; and
    a control circuit configured to turn on the protective device when the bus voltage is above the lower voltage level and to turn off the protective device when the bus voltage is at or below the lower voltage level.

2. The interface of claim 1, wherein the control circuit is configured to turn off the protective device when the bus voltage is below a maximum permitted value for the lower voltage level and above 0V.

3. The interface of claim 1, wherein the control circuit is configured to drive a gate terminal of the protective device towards 0V to transition the bus from the first logical state to the second logical state, and wherein the voltage at the gate terminal of the protective device determines the lower voltage level for the bus.

4. The interface of claim 1, wherein the control circuit comprises a series-connected first p-channel transistor device and second p-channel transistor device coupled in parallel with the power transistor.

5. The interface of claim 4, wherein:
    a source terminal and a body region of the first p-channel transistor device are coupled to the protective device;
    a drain terminal and a gate terminal of the first p-channel transistor device are coupled to a source terminal of the second p-channel transistor device;
    a body region of the second p-channel transistor device is coupled to the protective device; and
    a gate terminal of the second p-channel transistor device is coupled to a drain terminal of the second p-channel transistor device and to a gate terminal of the protective device.

6. The interface of claim 4, wherein:
    the control circuit further comprises a first n-channel transistor device coupled in series between the second p-channel transistor device and ground;
    the first n-channel transistor device is configured to turn off when the bus voltage drops below a threshold voltage of the first n-channel transistor device; and
    the control circuit is configured to turn off the protective device when the bus voltage drops below a threshold voltage of the protective device less a forward voltage of a body diode of the first n-channel transistor device.

7. The interface of claim 6, wherein:
    a source terminal and a body region of the first n-channel transistor device are coupled to ground;
    a drain terminal of the first n-channel transistor device is coupled to a drain terminal of the second p-channel transistor device; and
    a gate terminal of the first n-channel transistor device is coupled to the drain terminal of the first n-channel transistor device.

8. The interface of claim 6, wherein:
    the control circuit further comprises a charge pump coupled in parallel with the first n- channel transistor device; and
    the charge pump is configured to maintain a negative voltage at the gate terminal of the protective device when the bus is in the second logical state.

9. The interface of claim 6, wherein:
    the control circuit further comprises a second n-channel transistor device coupled in series between the first n-channel transistor device and ground;
    the second n-channel transistor device is configured to turn off when the bus is in the first logical state.

10. The interface of claim 9, wherein:
    a source terminal of the first n-channel transistor device is coupled to a drain terminal of the second n-channel transistor device;
    a drain terminal and a gate terminal of the first n-channel transistor device are coupled to a drain terminal of the second p-channel transistor device;
    a body region of the first n-channel transistor device and both a source terminal and a body region of the second n-channel transistor device are coupled to ground; and
    a gate terminal of the second n-channel transistor device is controlled by the logical state of the bus such that the second n-channel transistor device turns off when the bus is in the first logical state.

11. The interface of claim 9, wherein:
    the control circuit further comprises a charge pump coupled in parallel with the series-connected first n-channel transistor device and second n-channel transistor device; and
    the charge pump is configured to maintain a negative voltage at the gate terminal of the protective device when the bus is in the second logical state.

12. The interface of claim 6, wherein the control circuit further comprises a resistor connected in series between a drain terminal of the second p-channel transistor device and a drain terminal of the first n-channel transistor device.

13. The interface of claim 6, wherein the control circuit further comprises a second n-channel transistor device and a current source coupled to a drain terminal of the second n-channel transistor device.

14. The interface of claim 13, wherein:
both a source terminal and a body region of the second n-channel transistor device are coupled to ground; and
a gate terminal of the second n-channel transistor device is coupled to both a drain terminal of the second n-channel transistor device and to a gate terminal of the first n-channel transistor device.

15. The interface of claim 13, wherein:
the control circuit further comprises a charge pump coupled in parallel with the first n-channel transistor device; and
the charge pump is configured to maintain a negative voltage at the gate terminal of the protective device when the bus is in the second logical state.

16. The interface of claim 15, wherein:
the control circuit further comprises a third n-channel transistor device coupled in series between the first n-channel transistor device and the second p-channel transistor device; and
the third n-channel transistor device is configured to turn off when the bus is in the first logical state.

17. The interface of claim 4, wherein the control circuit further comprises a current source connected in series between a drain terminal of the second p-channel transistor device and ground.

18. The interface of claim 1, wherein:
the protective device comprises a p-channel transistor device having a drain terminal coupled to the bus and a source terminal coupled to the power transistor;
the control circuit is configured to drive a gate terminal of the p-channel transistor device towards 0V to transition the bus from the first logical state to the second logical state; and
wherein the voltage at the gate terminal of the p-channel transistor device determines the lower voltage level for the bus.

19. The interface of claim 1, wherein:
the protective device comprises a first p-channel transistor device monolithically integrated with a second p-channel transistor device such that the first p-channel transistor device and the second p-channel transistor device share a common body region;
a source terminal of the first p-channel transistor device is coupled to the power transistor;
a drain terminal of the first p-channel transistor device and a drain terminal of the second p-channel transistor device are coupled to the bus;
a source terminal of the second p-channel transistor device is coupled to the common body region; and
a gate terminal of the first p-channel transistor device and a gate terminal of the second p- channel transistor device are coupled to the control circuit.

20. The interface of claim 1, wherein the bus is a local interconnect network (LIN) bus.

21. The interface of claim 1, wherein the bus is a clock extension peripheral interface (CXPI) bus.

22. A transceiver comprising the interface of claim 1, the transceiver further comprising:
a first pin coupled to the output stage and configured to be coupled to the bus;
a second pin configured to receive a transmit data stream from a controller;
a transmit circuit configured to convert the received transmit data stream to a bus signal provided to the interface;
a receive circuit configured to read back the bus signal from the bus and indicate the logical state of the bus based on the voltage level of the bus signal; and
a third pin configured to communicate the logical state of the bus as indicted by the receive circuit to the controller.

23. A battery management semiconductor die, comprising:
logic configured to measure one or more parameters associated with charging and/or discharging a battery; and
an interface configured to communicate measurement results for the battery via a bus over which a first logical state is conveyed by a higher voltage level and a second logical state is conveyed by a lower voltage level,
wherein the interface comprises:
an output stage comprising a power transistor configured to drive the lower voltage level onto the bus to convey the second logical state and a protective device between the power transistor and the bus, the protective device configured to couple the power transistor to the bus when the protective device is turned on and to limit negative voltage excursions at the power transistor when the protective device is turned off; and
a control circuit configured to turn on the protective device when the bus voltage is above the lower voltage level and to turn off the protective device when the bus voltage is at or below the lower voltage level.

24. A method of interfacing with a bus over which a first logical state is conveyed by a higher voltage level and a second logical state is conveyed by a lower voltage level, the method comprising:
driving, via an output stage having a power transistor and a protective device, the lower voltage level onto the bus to convey the second logical state, wherein the protective device is configured to couple the power transistor to the bus when the protective device is turned on and to limit negative voltage excursions at the power transistor when the protective device is turned off; and
controlling a voltage at a gate terminal of the protective device such that the protective device turns on when the bus voltage is above the lower voltage level and the protective device turns off when the bus voltage is at or below the lower voltage level.

* * * * *